(12) United States Patent
Schafgans et al.

(10) Patent No.: US 10,663,866 B2
(45) Date of Patent: May 26, 2020

(54) WAVELENGTH-BASED OPTICAL FILTERING

(71) Applicant: ASML Netherlands B.V., Veldhoven (NL)

(72) Inventors: Alexander Anthony Schafgans, San Diego, CA (US); Igor Vladimirovich Fomenkov, San Diego, CA (US); Yezheng Tao, San Diego, CA (US); Rostislav Rokitski, La Jolla, CA (US); Robert Jay Rafac, Encinitas, CA (US); Daniel John William Brown, San Diego, CA (US); Cory Alan Stinson, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/270,072

(22) Filed: Sep. 20, 2016

(65) Prior Publication Data

US 2018/0081280 A1    Mar. 22, 2018

(51) Int. Cl.
*G03F 7/20*    (2006.01)
*G02B 5/28*    (2006.01)
(Continued)

(52) U.S. Cl.
CPC ......... *G03F 7/70191* (2013.01); *G02B 5/208* (2013.01); *G02B 5/283* (2013.01);
(Continued)

(58) Field of Classification Search
CPC ...... H05G 2/003; H05G 2/008; H01S 3/0064; H01S 3/2232; H01S 3/2308;
(Continued)

(56) References Cited

U.S. PATENT DOCUMENTS 5,726,805 A    3/1998    Kaushik et al.
7,491,954 B2    2/2009    Bykanov et al.
(Continued)

FOREIGN PATENT DOCUMENTS

JP    WO 2014119198 A1 *    8/2014    ........... H01S 3/2232

OTHER PUBLICATIONS

"Gain Bandwidth," Encyclopedia of Laser Physics and Technology, https://www.rp-photonics.com/gain_bandwidth.hml, pp. 1-2 (2 total pages), printed on Jun. 20, 2016.
(Continued)

*Primary Examiner* — Deoram Persaud
(74) *Attorney, Agent, or Firm* — DiBerardino McGovern IP Group LLC

(57) ABSTRACT

An optical source for an extreme ultraviolet (EUV) photolithography tool includes a light-generation system including a light-generation module; an optical amplifier including a gain medium associated with a gain band, the gain medium configured to amplify light having a wavelength in the gain band; and a wavelength-based optical filter system on a beam path between the light-generation module and the optical amplifier, the wavelength-based optical filter system including at least one optical element configured to allow light having a wavelength in a first set of wavelengths to propagate on the beam path and to remove light having a wavelength in a second set of wavelengths from the beam path, the first set of wavelengths and the second set of wavelengths including different wavelengths in the gain band of the optical amplifier.

25 Claims, 14 Drawing Sheets

(51) Int. Cl.
  *G02B 5/20* (2006.01)
  *G02B 27/14* (2006.01)
  *G02B 27/42* (2006.01)
  *H01S 3/00* (2006.01)
  *H01S 3/23* (2006.01)
  *H01S 3/223* (2006.01)

(52) U.S. Cl.
  CPC ....... *G02B 27/141* (2013.01); *G02B 27/4222* (2013.01); *G03F 7/70033* (2013.01); *G03F 7/70575* (2013.01); *H01S 3/0078* (2013.01); *H01S 3/2308* (2013.01); *H01S 3/2232* (2013.01); *H01S 3/2391* (2013.01)

(58) Field of Classification Search
  CPC .... H01S 3/2391; H01S 2301/02; H01S 3/005; H01S 3/0078; H01S 3/0085; H01S 3/10023; H01S 3/2316; G03F 7/70033; H01J 11/10; H01J 11/44; H01J 2211/444; H01J 2211/446; H05K 9/0096; G02F 1/0136; G02F 1/09
  See application file for complete search history.

(56) References Cited

U.S. PATENT DOCUMENTS

| | | | |
|---|---|---|---|
| 8,351,473 B1 | 1/2013 | Darcie et al. | |
| 8,680,495 B1 | 3/2014 | Tao et al. | |
| 9,667,019 B2* | 5/2017 | Moriya | H01S 3/2232 |
| 9,743,503 B2* | 8/2017 | Kurosawa | H01S 3/2232 |
| 2002/0071468 A1* | 6/2002 | Sandstrom | G03F 7/70025 |
| | | | 372/57 |
| 2006/0146906 A1* | 7/2006 | Brown | H01S 3/094 |
| | | | 372/57 |
| 2007/0248136 A1* | 10/2007 | Leonardo | B23K 26/067 |
| | | | 372/55 |
| 2008/0013163 A1* | 1/2008 | Leonardo | G02F 1/353 |
| | | | 359/341.31 |
| 2008/0069157 A1* | 3/2008 | Ariga | H01S 3/2308 |
| | | | 372/21 |
| 2008/0087847 A1 | 4/2008 | Bykanov et al. | |
| 2010/0078577 A1 | 4/2010 | Moriya et al. | |
| 2010/0277804 A1* | 11/2010 | Galvanauskas | G02B 27/1006 |
| | | | 359/583 |
| 2013/0321926 A1* | 12/2013 | Bergstedt | G02B 27/145 |
| | | | 359/634 |
| 2014/0028988 A1 | 1/2014 | Rafac et al. | |
| 2014/0264091 A1* | 9/2014 | Fleurov | H05G 2/008 |
| | | | 250/504 R |
| 2014/0300950 A1* | 10/2014 | Nowak | H01S 3/10007 |
| | | | 359/333 |
| 2015/0340838 A1* | 11/2015 | Moriya | H01S 3/2232 |
| | | | 250/504 R |
| 2015/0351208 A1* | 12/2015 | Suganuma | H01S 3/2232 |
| | | | 250/504 R |
| 2016/0007434 A1* | 1/2016 | Tao | H05G 2/008 |
| | | | 250/504 R |
| 2016/0172416 A1 | 6/2016 | Hendrix et al. | |
| 2016/0192468 A1 | 6/2016 | Rafac et al. | |
| 2017/0099721 A1 | 4/2017 | Tao et al. | |
| 2017/0242343 A1* | 8/2017 | Pandey | G01N 21/4788 |
| 2018/0081280 A1* | 3/2018 | Schafgans | H01S 3/2308 |

OTHER PUBLICATIONS

Lowenthal et al., "ASE Effects in Small Aspect Ratio Laser Oscillators and Amplifiers with Nonsaturable Absorption," IEEE Journal of Quantum Electronics, vol. QE-22, No. 8, Aug. 1986, pp. 1165-1173 (9 total pages).

Blaine R. Copenheaver, U.S. International Searching Authority, International Search Report and Written Opinion, counterpart PCT Application No. PCT/US2017/051666, dated Nov. 21, 2017, 11 pages total.

* cited by examiner

930

WAVELENGTH-BASED OPTICAL FILTERING

TECHNICAL FIELD

The disclosed subject matter relates to wavelength-based optical filtering. For example, a wavelength-based optical filter system may be included in an extreme ultraviolet (EUV) light source to provide optical isolation between a light-generation module and an optical amplifier. The optical filter system also may provide isolation between the light-generation module and a plasma generated by an interaction between target material and amplified light.

BACKGROUND

Extreme ultraviolet ("EUV") light, for example, electromagnetic radiation having wavelengths of around 50 nm or less (also sometimes referred to as soft x-rays), and including light at a wavelength of about 13 nm, may be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma may be produced by irradiating a target material, for example, in the form of a droplet, plate, tape, stream, or cluster of material, with an amplified light beam that may be referred to as a drive laser. For this process, the plasma is typically produced in a sealed vessel, for example, a vacuum chamber, and monitored using various types of metrology equipment.

SUMMARY

In one general aspect, an optical source for an extreme ultraviolet (EUV) photolithography tool includes a light-generation system including a light-generation module; an optical amplifier including a gain medium associated with a gain band, the gain medium configured to amplify light having a wavelength in the gain band; and a wavelength-based optical filter system on a beam path between the light-generation module and the optical amplifier, the wavelength-based optical filter system including at least one optical element configured to allow light having a wavelength in a first set of wavelengths to propagate on the beam path and to remove light having a wavelength in a second set of wavelengths from the beam path, the first set of wavelengths and the second set of wavelengths including different wavelengths in the gain band of the optical amplifier.

Implementations may include one or more of the following features. The at least one optical element may include one or more of a dispersive optical element, an optical filtering element, and an interferometer. The dispersive optical element may include one or more of a prism and a grating. The at least one optical filtering element may include one or more of an optical element including a multi-layer coating and an optical element configured to absorb light having one or more wavelengths in the second set of wavelengths. The interferometer may include an etalon. The dispersive optical element may include a grating, the grating being positioned to reflect light having a wavelength in the first set of wavelengths onto the beam path, and to reflect light having a wavelength in the second set of wavelengths away from the beam path. The wavelength-based optical filter system also may include at least one dichroic optical element. At least one dichroic optical element may be between the light-generation module and the grating.

In some implementations, the at least one optical element of the wavelength-based optical filter system may include at least one optical filtering element, the optical filtering element may be configured to reflect or transmit light having a wavelength in the first set of wavelengths, and the optical filtering element may be configured to absorb light having a wavelength in the second set of wavelengths. The optical filtering element may include a copper substrate and a coating on the copper substrate. The at least one optical element may include a set of optical filtering elements, the optical filtering elements of the set may be arranged to define a portion of the beam path in the optical filter system, and all of the optical filtering elements of the set may be configured to allow light having a wavelength in the first set of wavelengths to propagate on the beam path and to remove light having a wavelength in the second set of wavelengths from the beam path. The at least one optical element may include a first set of optical filtering elements and a second set of optical filtering elements, the first set of optical filtering elements may be arranged to define a first beam path in the optical filter system, and the second set of optical filtering elements may be arranged to define a second beam path in the optical filter system. The optical filtering elements of the first set may be configured to allow light having a first wavelength in the first set of wavelengths to propagate on the first beam path in the optical filter system, the optical filtering elements of the second set may be configured to allow light having a second wavelength in the first set of wavelengths to propagate on the second beam path in the optical filter system, the second wavelength being different from the first wavelength, and the optical filtering elements of the first set and the second set may be configured to absorb light having a wavelength in the second set of wavelengths.

The optical source also may include a polarization-based optical isolation system configured to transmit light having a first polarization and to block light having a second polarization, where the second polarization is different from the first polarization, and the wavelength-based optical filter system is between the light-generation module and the polarization-based optical isolation system.

The light-generation module may include more than one light-generation module, one of the light-generation modules being configured to generate a first light beam having a first wavelength, and another one of the light-generation modules being configured to generate a second light beam having a wavelength at a second wavelength, the first and second wavelengths being in the first set of wavelengths. Each light-generation module may be a laser.

The light-generation system of the optical source also may include one or more optical amplifiers positioned to receive light emitted from the light-generation module. The wavelength-based optical filter system may be between an optical amplifier in the light-generation system and the light-generation module. The light-generation system may include more than one optical amplifier, and the wavelength-based optical filter system may be between two optical amplifiers in the light-generation system.

The optical amplifier may include a plurality of optical amplifiers, each of the optical amplifiers including a gain medium associated with the gain band, and the wavelength-based optical filter system may be between two of the optical amplifiers. The two optical amplifiers may be separate from the light-generation system.

The light-generation module may be a carbon dioxide ($CO_2$) laser.

In some implementations, the light source also includes a second light-generation system separate from the light-generation system, the second light-generation system being configured to emit an optical beam, the optical beam having a wavelength in the first set of wavelengths.

The first set of wavelengths may include only a single wavelength.

The first set of wavelengths may include plurality of wavelengths.

The second set of wavelengths may include all wavelengths in the gain band other than any wavelength that is in the first set of wavelengths.

In another general aspect, an optical filter system for an extreme ultraviolet (EUV) light source is configured for placement between an optical amplifier and a light-generation module of the EUV light source, the optical amplifier including a gain medium configured to amplify light within a gain band, and the optical filter system includes at least one optical element, the at least one optical element being configured to reflect or transmit light having a wavelength in a first wavelength band and to reject light having a wavelength in a second wavelength band, the first and second wavelength bands being in the gain band of the amplifier, and the first wavelength band and the second wavelength band include entirely different wavelengths.

Implementations include one or more of the following features. The first wavelength band may include a first wavelength associated with a pre-pulse beam and a second wavelength associated with a main beam. The optical filter system also may include at least one dichroic optical element.

The at least one optical element may include one or more of an optical filtering element, a dispersive optical element, and an interferometer. The dispersive optical element may be one or more of a prism and a grating. The optical filtering element may be one or more of an optical element including a multi-layer coating and an optical element configured to absorb light having particular wavelengths.

In another general aspect, a light beam is emitted from a light-generation module onto a beam path, the beam path being between the light-generation module and a plasma site, and the light beam having a first wavelength; the light beam is passed through an optical filter system; light that exits the optical filter system is directed to an optical amplifier to produce an amplified light beam, the optical amplifier including a gain medium that amplifies light that is in a gain band; and the amplified light beam is provided to the plasma site, the plasma site receiving target material that, when in a plasma state, emits EUV light, where the first wavelength is in the gain band of the optical amplifier, the optical filter system allows light having the first wavelength to propagate on the beam path, and the optical filter system removes light having a wavelength other than the first wavelength that is in the gain band of the optical amplifier from the beam path.

Implementations may include one or more of the following features. A may be provided target to the plasma site, the target including the target material. The amplified light beam may have an energy sufficient to convert at least some of the target material to the plasma state that emits EUV light.

In another general aspect, an optical source for a photolithography tool includes a light-generation module configured to emit an optical beam; an optical amplifier including a gain medium on a beam path, the gain medium being associated with a gain band, the optical amplifier being configured to amplify light having a wavelength in the gain band; and a wavelength-based optical loss system on the beam path between the light-generation module and the optical amplifier, the wave-length based optical loss system configured to remove light at one or more wavelengths in the gain band from the beam path.

Implementations of any of the techniques described above may include an EUV light source, a method, a process, a device, or an apparatus. The details of one or more implementations are set forth in the accompanying drawings and the description below. Other features will be apparent from the description and drawings, and from the claims.

DRAWING DESCRIPTION

FIGS. 2-5, 10, and 11 are block diagrams of exemplary extreme ultraviolet (EUV) light sources.

FIGS. 6, 7, 8A, and 9A are block diagrams of exemplary optical filter systems that may be used in an EUV light source.

Figure 8A:
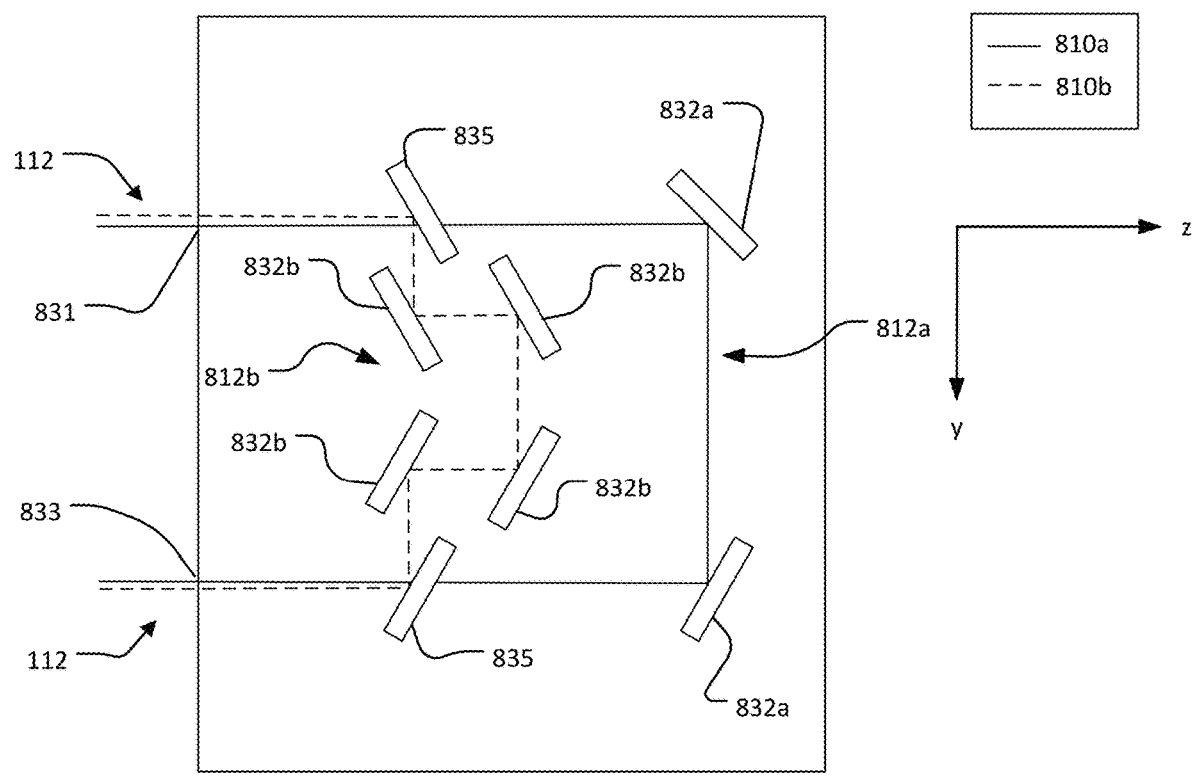
Figure 8B:
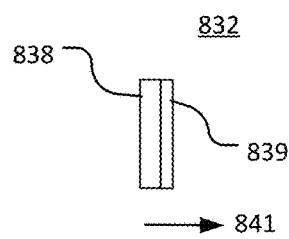
Figure 9A:
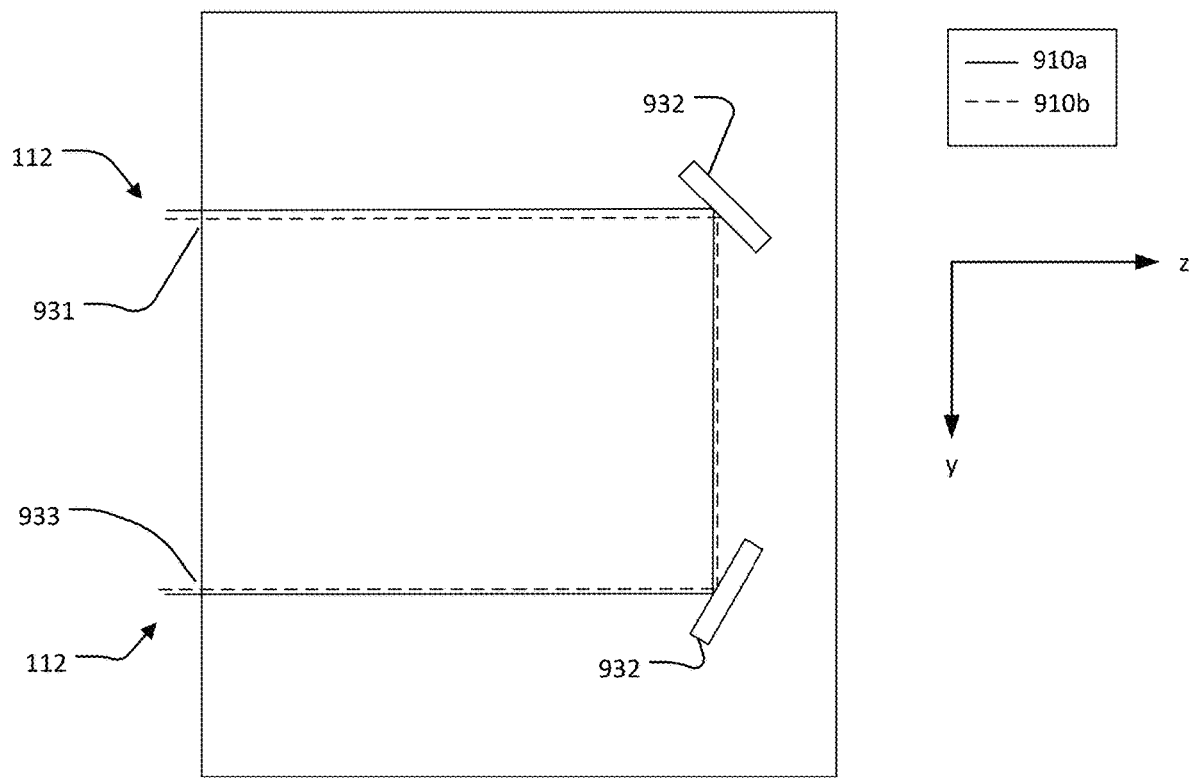
Figure 9B:
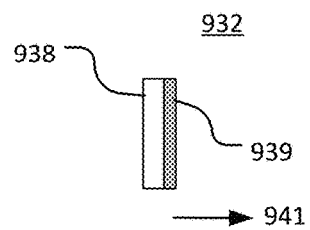

FIGS. 8B and 9B are side views of exemplary optical elements that may be used in the optical filter systems of FIGS. 8A and 9B, respectively.

Figure 12A:
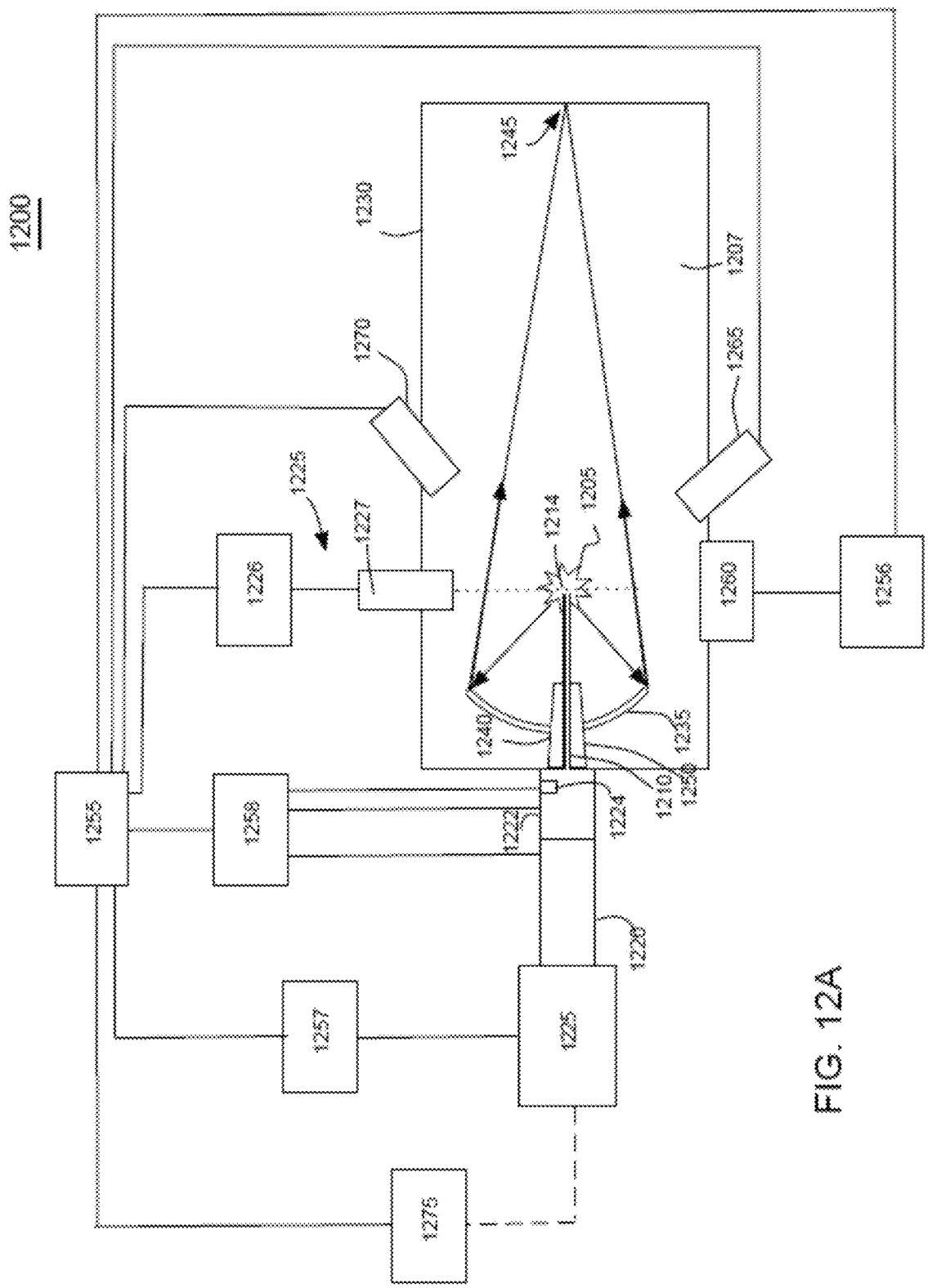
Figure 12B:
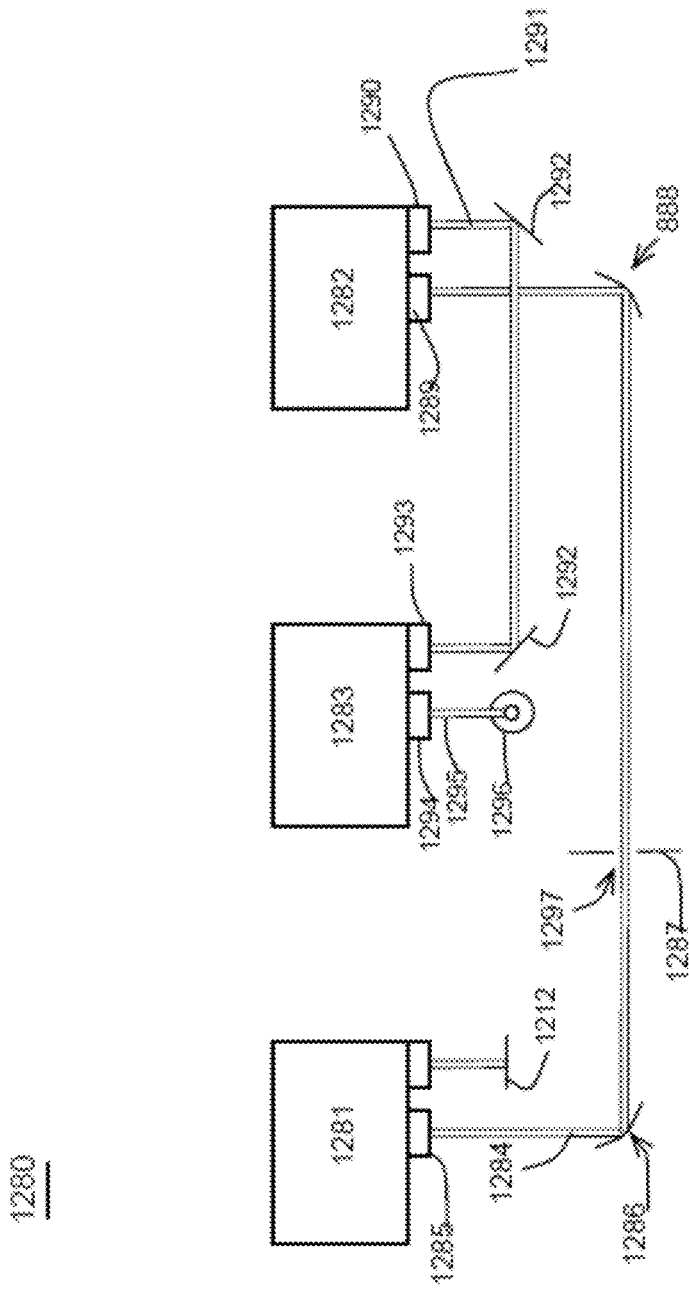

FIGS. 12A and 12B are block diagrams of a drive laser system for an extreme EUV light source.

DETAILED DESCRIPTION

A wavelength-based optical filter system is disclosed. The wavelength-based optical filter system may be used to reduce or eliminate amplified spontaneous emission (ASE) in an optical source of an EUV light source. The wavelength-based optical filter system may be used alone or with optical isolation devices that may isolate or filter extraneous light other than ASE, such as polarization-based optical isolation devices and/or acousto-optic optical isolation devices.

Figure 1A:
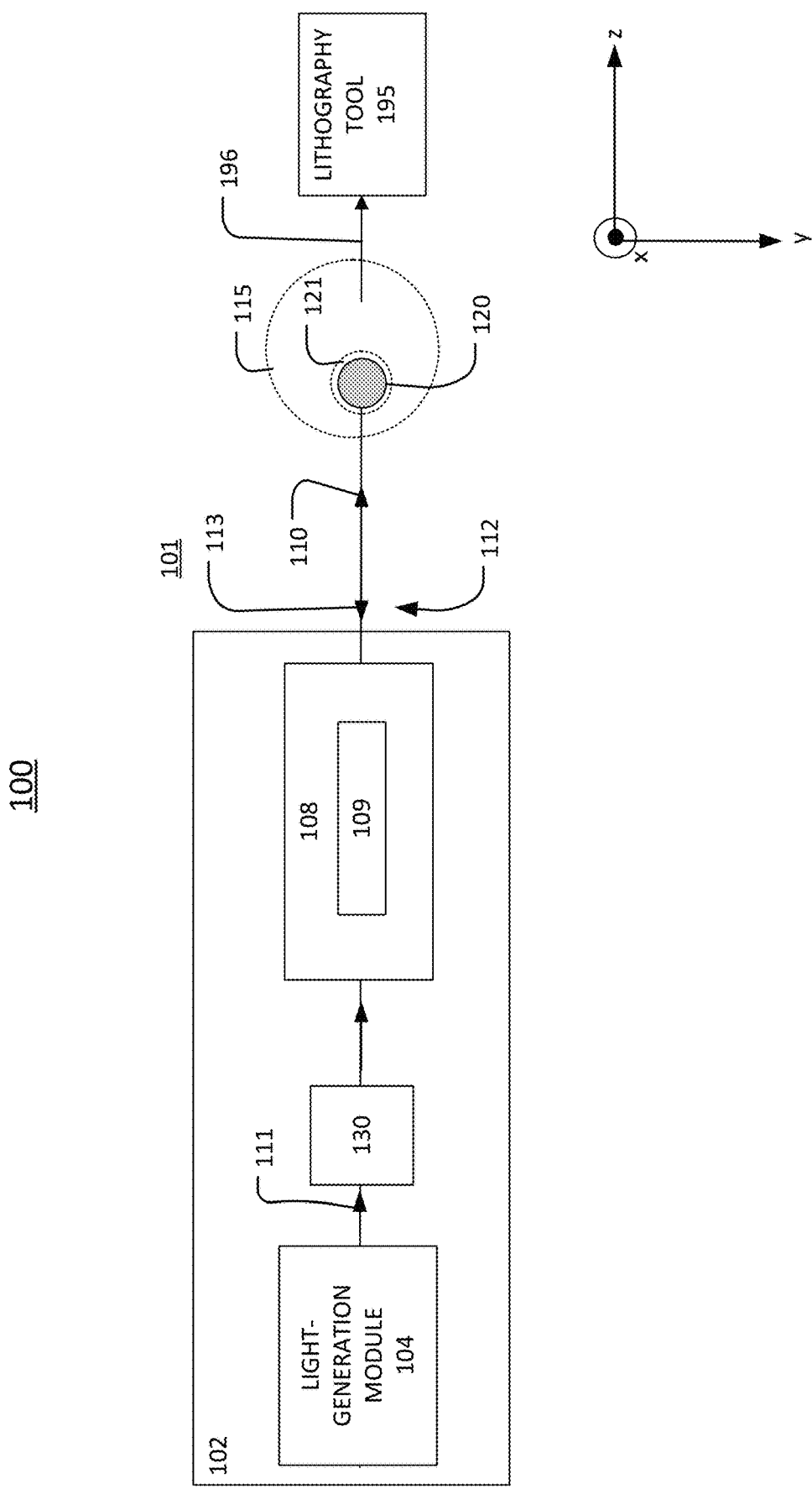
FIG. 1A is a block diagram of an exemplary optical lithography system.

Referring to FIG. 1A, a block diagram of an exemplary optical lithography system 100 is shown. The optical system 100 includes an extreme ultraviolet (EUV) light source 101 that generates EUV light 196 for use in a photolithography tool 195. The optical system 100 includes an optical source 102, which emits a light beam 110 that propagates along a path 112 in a direction z toward a target region 115. The target region 115 receives a target 120, which includes target material that emits EUV light when converted to plasma.

The optical source 102 includes a light-generation module 104, a wavelength-based optical filter system 130, and an optical amplifier 108, which includes a gain medium 109 that is on the path 112. The light-generation module 104 is a source of light (for example, one or more lasers, lamps, or any combination of such elements). The optical amplifier 108 may include more than one optical amplifier arranged with the respective gain mediums on the path 112. The optical amplifier 108 may be all or part of a drive laser system, such as the drive laser system 1280 of FIG. 12B. The optical amplifier 108 may be a pre-amplifier, such as the pre-amplifier 207 of FIG. 2. The light-generation module 104 produces an initial light beam 111. The initial light beam 111 is amplified by the optical amplifier 108 to produce the light beam 110. The initial light beam 111 has a wavelength in the gain band of the gain medium 109.

The gain band associated with the gain medium 109 is defined by a range, set, or band of wavelengths. The gain band may be a collection of discrete wavelengths or one or more continuous ranges of wavelengths. The gain medium 109 only amplifies light that has a wavelength in the gain band. The wavelengths in the gain band are determined by the material properties of the gain medium 109. The gain medium 109 includes carriers (such as electrons) that are excited when the medium 109 is pumped by an energy source such as, for example, a flash lamp, another laser source, exothermal chemical reactions, or electric discharge. The gain medium 109 is a material (for example, a gas, a semiconductor, a non-gaseous dielectric, or a crystal) that includes a radiating species that has a lowest energy level (for example, a ground state) in which carriers reside when the medium 109 is not pumped. The radiating species depends on the type of medium 109, and may be, for example, atoms or molecules.

When the medium 109 is pumped, the carriers are excited to a higher energy level, and light is emitted by the medium 109 when the carriers transition from the excited energy level to a lower energy level. The wavelength of the emitted light is determined by the energy difference between the excited energy level and the lower energy level. The quantum properties of the gain medium 109 determine the possible energy differences, and the possible energy differences determine the wavelengths that are in the gain band of the medium 109.

The interaction between the initial light beam 111 and the pumped medium 109 amplifies the initial light beam 111, which has a wavelength in the gain band. However, in addition to amplifying the initial light beam 111, the pumped medium 109 also may emit light that results from excited carriers spontaneously transitioning from any of the excited higher energy levels of the medium to lower energy levels. These spontaneous transitions may be optically amplified, and in this case, they are referred to as amplified spontaneous emission (ASE). ASE may occur at any wavelength in the gain band and may be considered noise.

As discussed in greater detail below, the wavelength-based optical filter system 130 is placed between the light-generation module 104 and the optical amplifier 108 to prevent or reduce the ASE on the path 112. ASE may be considered to be uncontrolled energy flow that is capable of reaching the target region 115. To generate the plasma that emits EUV light efficiently, the optical source 102 is controlled such that the light beam 110 and the target 120 coincide spatially and temporally at an irradiation location 121 in the target region 115. However, because ASE is essentially uncontrolled or parasitic light, ASE may reach the target region 115 in a manner that is unexpected.

ASE that reaches the target region 115 may interfere with the production of the plasma (and thus may interfere with the production of EUV light). For example, ASE may reach the target region 115 at a location that is in the −y direction compared to the irradiation location 121 while the target 120 is traveling in the y direction. In this example, ASE may interact with the target 120, causing reflections that propagate back into the source 102 and/or modifying the target 120 in unexpected ways. Both of these outcomes may be deleterious to the efficient production of the plasma and may reduce the amount of EUV light that is produced. For example, because the ASE is light of a wavelength in the gain band, reflections of the ASE that propagate along the path 112 in the −z direction (such as a reflection 113) may deplete excited carriers in the amplifier 108, leaving fewer carriers to amplify the initial light beam 111. Additionally or alternatively, the reflections may initiate oscillation in a temporary cavity formed by the traveling target 120 and an element in the optical source 102. Such oscillations may result in additional ASE-generated light arriving unexpectedly in the target region 115.

ASE that interacts with the target 120 prior to the light beam 110 interacting with the target 120 may impact the efficiency of the conversion of the target material to plasma by changing the geometric distribution and/or the orientation of the target material in unexpected ways. This may result in reduced amounts of EUV light being produced when the target 120 is converted to a plasma. Additionally, these variations may result in variations in the amount of EUV light that is provided to the lithography tool 195 over time. Such variations may result in defects in electronic features in wafer exposed by the tool 105 and/or reduced performance of the lithography tool 195.

The wavelength-based optical filter system 130 counters the effects of ASE by removing wavelengths that are in the gain band of the optical amplifier 108 but are not intended to reach the target region 115 from the beam path 112. The filter system 130 may be considered to be a wavelength-based optical loss system that selectively increases the amount of loss of particular wavelengths in the gain band such that these wavelengths are unable to propagate as ASE on the path 112 or are otherwise mitigated. For example, the filter system 130 may remove wavelengths that are not in the initial beam 111 from the beam path 112. The wavelength or wavelengths that are in the initial light beam 111 may be considered to be a first set of one or more wavelengths in the gain band, and the wavelengths that are removed from the path 112 are a second set of one or more wavelengths in the gain band. The wavelengths in the second set are different than the wavelengths in the first set, and the wavelengths in the second set may include all or any of the wavelengths in the gain band that are not in the first set.

Each of the first and second sets may include a collection discrete wavelengths, one or more continuous bands of wavelengths, or a single wavelength. The wavelengths in the first and second sets may be different by including entirely different wavelengths. For example, the first set of wavelengths may include a band of wavelengths centered around 10.6 μm and a band of wavelengths centered around 10.26 μm, and the second set may include wavelengths other than 10.6 μm, 10.26 μm, and the wavelengths that are included in the bands centered on these wavelengths. In some implementations, the wavelengths in the first and second set of wavelengths may have some spectral overlap. For example, the wavelengths included in the bands centered on 10.6 μm and 10.26 μm may be present in the first and second set, though the wavelengths 10.6 μm and 10.26 μm are only included in the first set of wavelengths and are not in the second set of wavelengths. The second set of wavelengths may include any wavelength in the gain band of the gain medium 109. For example, the wavelengths in the second set of wavelengths may include wavelengths that are less than the smallest wavelength in the first set of wavelengths and wavelengths that are greater than the largest wavelength in the first set of wavelengths.

Figure 1B:
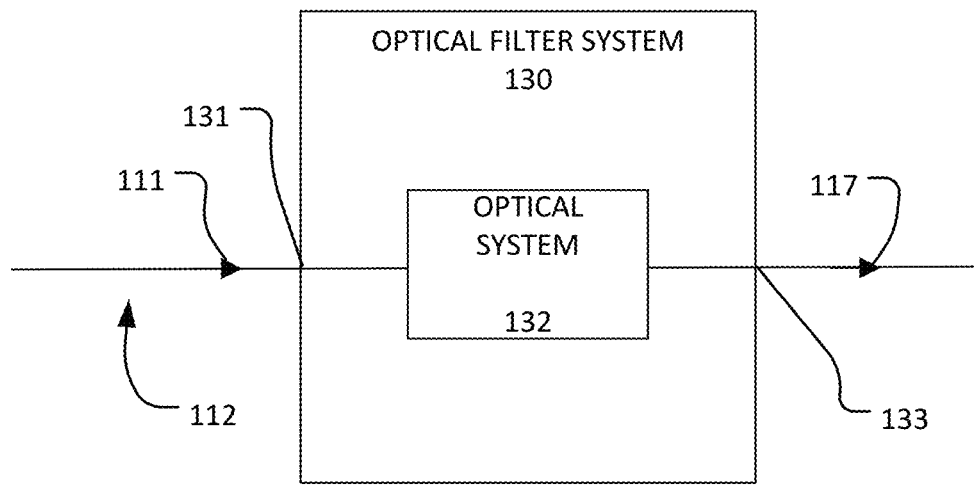
FIG. 1B is a block diagram of an exemplary optical filter system that may be used in the optical lithography system of FIG. 1A.

Referring to FIG. 1B, a block diagram of the exemplary wavelength-based optical filter system 130 is shown. The optical filter system 130 is on the path 112 and receives the initial light beam 111 at an input 131. The optical filter system 130 includes an optical system 132. The optical system 132 includes one or more optical elements or components that allow light having a wavelength in a first set of wavelengths to propagate on the path 112 and remove light having a wavelength in a second set of wavelengths from the path 112. The optical system 132 may remove light having a wavelength in the second set from the path 112 by, for example, absorbing, transmitting, and/or deflecting light having those wavelengths.

The one or more optical elements may include any device or component that is capable of interacting with light. The one or more optical elements may include, for example, lenses, mirrors, prisms, dichroic elements, or a combination of such elements. The optical elements may include dispersive optical elements (such as a prism or a grating), optical filtering elements, and/or an interferometer (such as an etalon). The optical filtering elements may be any element that reflects, transmits, and/or absorbs light based on the wavelength of the light. For example, the optical filtering element may be an optical element (such as a lens or a mirror) or a substrate (such as a copper substrate) with one or more layers of material deposited on the substrate or the optical element, where the presence of the layers of material alter the wavelengths that are transmitted, reflected, and/or absorbed. An example of an optical element that is configured to absorb certain wavelengths is a fluid cell, which includes an optically transparent gas or liquid that absorbs light having certain wavelengths. The optical filter system 130 also may include other optical elements such as, for example, mirrors and/or lenses, that are used to steer, direct, and/or focus light that propagates in the optical filter system.

The optical filter system 130 emits a light beam 117 at an output 133. The light beam 117 includes wavelengths that are in the first set of wavelengths, but includes little or no light at the wavelengths that are in the second set of wavelengths.

Additional example implementations of the optical filter system 130 are shown in FIGS. 6-9. Prior to discussing the details of various implementations of the optical filter system 130, further examples of optical systems in which an implementation of the optical filter system 130 may be used are discussed.

Figure 1B:
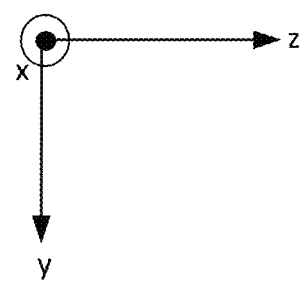
Figure 2:
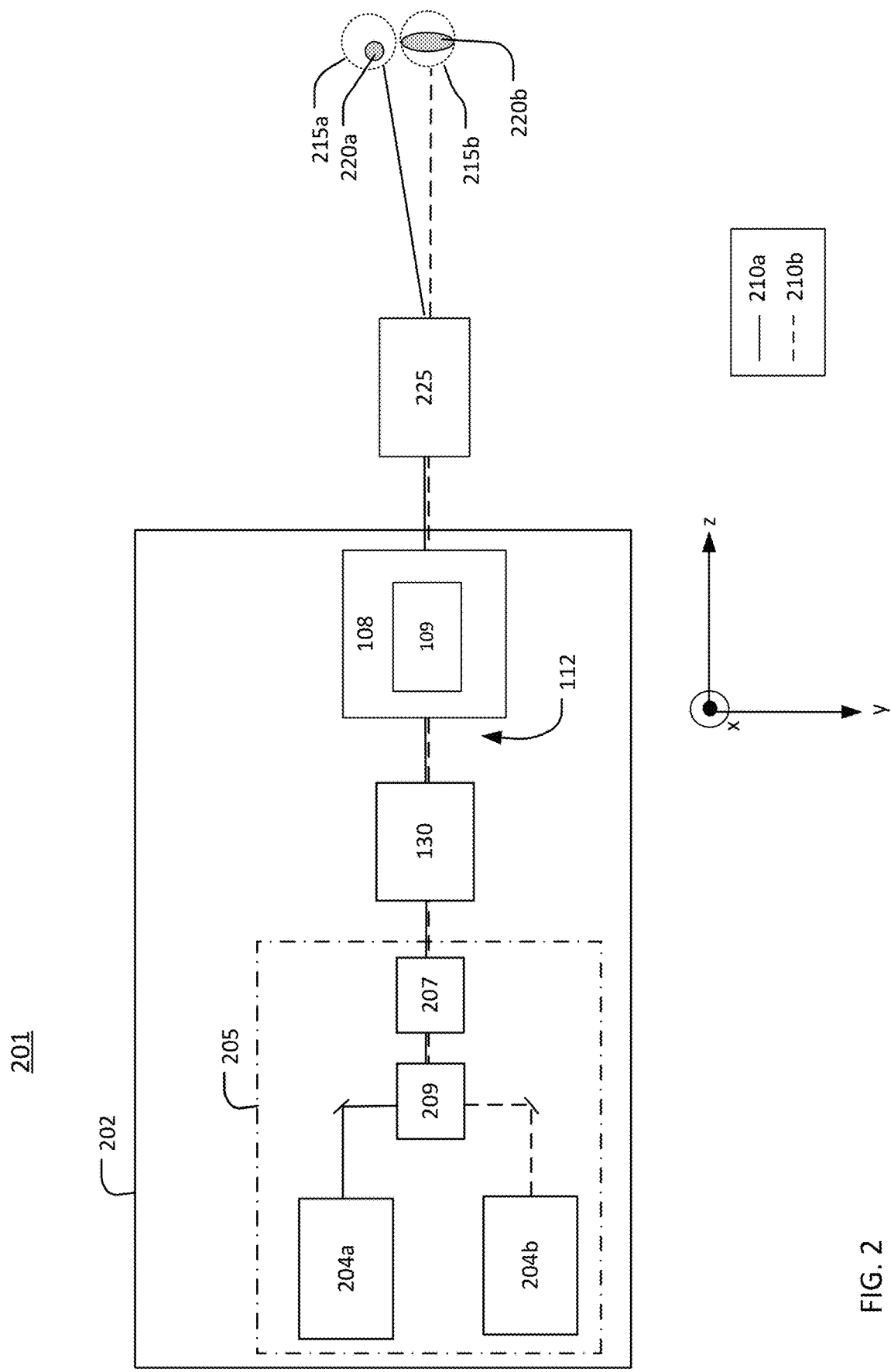

Referring to FIG. 2, a block diagram of an EUV light source 201 that includes an exemplary optical source 202 is shown. The optical source 202 may be used as the optical source 102 in the optical system 100 (FIG. 1). The EUV light source 201 uses a first light beam 210a (shown as a solid line in FIG. 2) to condition an initial target 220a, and a second light beam 210b (shown as a dashed line in FIG. 2) to convert the conditioned target into a plasma that emits EUV light. In the source 201, the first and second light beams 210a propagate on the path 112, and both of the light beams 210a, 210b are incident on the amplifier 108. In the example of FIG. 2, the optical filter system 130 is on the path 112, between the optical amplifier 108 and the light-generation system 205.

The optical source 202 includes a light-generation system 205, which includes two light-generation modules 204a, 204b. In the example of FIG. 2, the light-generation modules 204a, 204b produce the first and second light beams 210a, 210b, respectively. The light-generation modules 204a, 204b may be, for example, two lasers. For example, each of the light-generation modules 204a, 204b may be a carbon dioxide ($CO_2$) laser. In some implementations, each of the light-generation modules 204a, 204b are a different type of laser. For example, the light-generation module 204a may be a solid state laser (such as, for example, a neodymium (Nd):YAG laser or an erbium doped fiber laser), and the light-generation module 204b may be a $CO_2$ laser.

The first and second light beams 210a, 210b have different wavelengths within the gain band of the gain medium 109. For example, in implementations in which the light-generation modules 204a, 204b include two $CO_2$ lasers, the light beams 210a, 210b are generated from different lines of the $CO_2$ laser, resulting in the light beams 210a, 210b having different wavelengths even though both beams are generated from the same type of laser source. For example, the wavelength of the first light beam 210a may be about 10.26 micrometers ($\mu m$). The wavelength of the second light beam 210b may be between about 10.18 $\mu m$ and 10.26 $\mu m$, or the wavelength of the second light beam 210b may be about 10.59 $\mu m$. In implementations in which the first light-emitting module 204a is a solid state laser, the wavelength of the first light beam 210a may be, for example, 1.06 $\mu m$. The light beams 210a, 210b may have different intensities.

The light-generation system 205 also includes a beam combiner 209 that directs the first and second beams 210a, 210b onto the beam path 112. The beam combiner 209 may be any optical element or a collection of optical elements capable of interacting with the first beam 210a and/or the second beam 210b to direct the first and second beams 210a, 210b onto the beam path 112. For example, the beam combiner 209 may be a collection of mirrors, some of which are positioned to direct the first beam 210a onto the beam path 112 and others of which are positioned to direct the second beam 210b onto the beam path 112.

The light-generation system 205 also may include one or more pre-amplifiers (represented by a pre-amplifier 207 in FIG. 2). The pre-amplifier 207 receives and amplifies the first and second beams 210a, 210b within the light-generation module 204. The pre-amplifier 207 also includes a gain medium, and the pre-amplifier also may generate ASE.

The first and second beams 210a, 210b may propagate on the path 112 at different times, but both beams 210a, 210b traverse substantially the same spatial region through the optical source 202 and both pass through the gain medium 109 of the optical amplifier 108. In some implementations such as discussed with respect to FIGS. 6 and 8, the first and second beams 210a, 210b are separated within the optical filter system 130, and are rejoined to propagate on the path 112 to the optical amplifier 108.

In the implementation of FIG. 2, the first and second beams 210a, 210b are angularly dispersed by a beam delivery system 225 such that the first beam 210a is directed toward an initial target region 215a, and the second beam 210b is directed toward a modified target region 215b, which is displaced in the −y direction relative to the initial target region 215a. In some implementations, the beam delivery system 225 also focuses the first and second beams 210a, 210b to locations within or near the initial and modified target regions 215a, 215b, respectively.

The initial target region 215a receives an initial target 220a and the first beam 210a. The first beam 210a has an energy that is sufficient to modify the geometric distribution of target material in the initial target 220a (for example, the energy may be sufficient to initiate the spatial reconfiguration of the target material) into a modified target that is received in the modified target region 215b. The second beam 210b is also received in the modified target region 215b. The second beam 210b has an energy that is sufficient to convert at least some of the target material in the modified target 220b into a plasma that emits EUV light. In this example, the first beam 210a may be referred to as a "pre-pulse," and the second beam 210b may be referred to as the "main pulse."

In addition to the first beam 210a and the second beam 210b, parasitic light arising from ASE may be produced by the amplifier 108 and/or the pre-amplifier 207. The optical filter system 130 reduces the amount of ASE that propagates on the path 112 by removing from the path 112 light having wavelengths that are not the wavelengths of the first beam 210a or the second beam 210b but are in the gain band of the amplifier 108 and/or the pre-amplifier 207.

Figure 11:
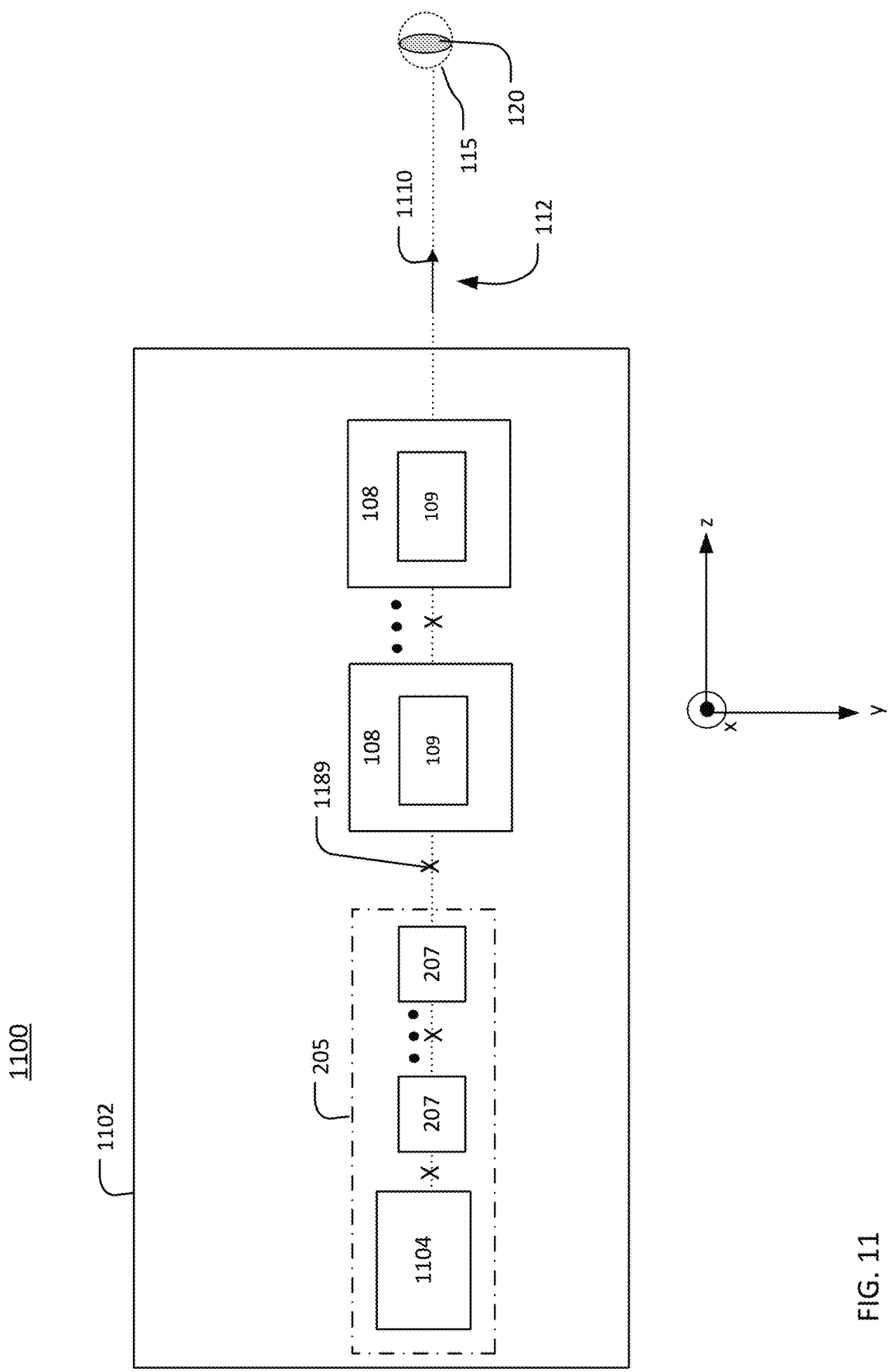

In the example shown in FIG. 2, the optical filter system 130 is between the pre-amplifier 207 and the amplifier 108. However, in some implementations, the optical filter system 130 may be between the pre-amplifier 207 and the light-generation modules 204a, 204b. Further, the light-generation system 205 may include more than one pre-amplifier 207. In these implementations, the optical filter system 130 may be between any two of the pre-amplifiers 207, or between the light-generation modules 204a, 204b and the pre-amplifier 207 nearest to the modules 204a, 204b. FIG. 11 shows examples of placement of the optical filter system 130.

Figure 3:
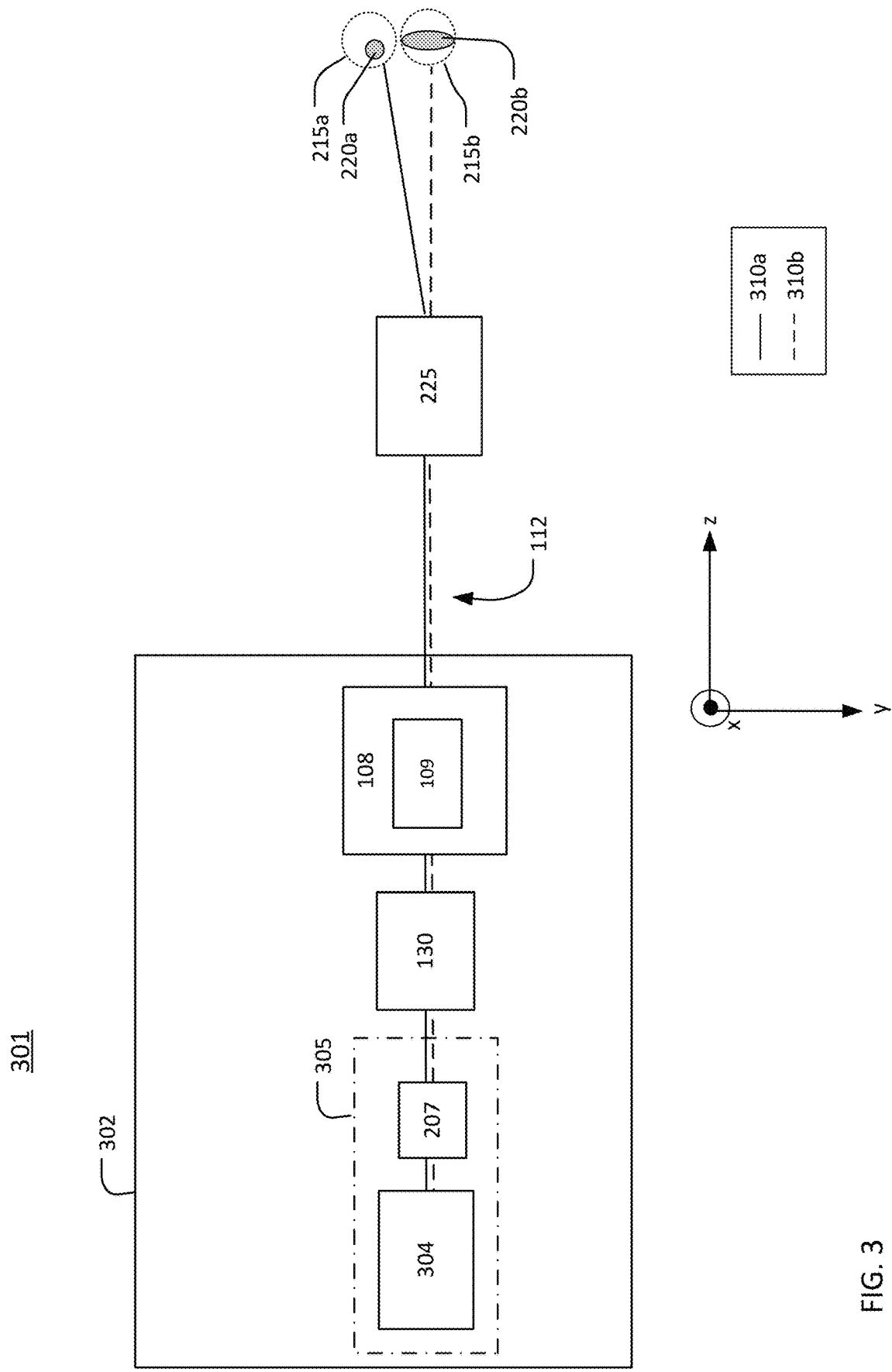

Referring to FIG. 3, a block diagram of an EUV light source 301 that includes another exemplary optical source 302 is shown. The optical source 302 may be used as the optical source 102 in the optical system 100 (FIG. 1A). The optical source 302 is similar to the optical source 202, but the optical source 302 uses a single light-generation module 304 to generate a first light beam 310a (shown with a solid line in FIG. 3) and a second light beam 310b (shown with a dashed line in FIG. 3). The EUV light source 301 uses the first light beam 310a to condition the initial target 220a, and the second light beam 310b to convert the conditioned target into a plasma that emits EUV light. In the EUV light source 301, the first and second light beams 310a propagate on the path 112, and both of the light beams 310a, 310b pass through the amplifier 108.

The optical source 302 includes a light-generation system 305. The light-generation system 305 includes the light-generation module 304 and a pre-amplifier 207, which receives the first and second light beams 310a, 310b. The optical source 302 may include more than one of the pre-amplifiers 207 arranged in series on the path 112. Because the first and second light beams 310a, 310b are produced by the same light-generation module 304, the light-generation system 305 does not include a beam combiner such as the beam combiner 209 (FIG. 2).

The first and second light beams 310a, 310b have different wavelengths that are within the gain band of the medium 109. The light-generation module 304 may be a laser that is capable of generating light of different wavelengths. For example, the light-generation module 304 may be a $CO_2$ laser. In these implementations, the light beams 310a, 310b are generated from different lines of the $CO_2$ laser, resulting in the light beams 310a, 310b having different wavelengths even though both beams are generated from the same laser source. For example, the wavelength of the first light beam 310a may be about 10.26 micrometers (μm) and the wavelength of the second light beam 310b may be between about 10.18 μm and 10.26 μm or the wavelength of the second light beam may be about 10.59 μm.

In the example shown in FIG. 3, the optical filter system 130 is between the pre-amplifier 207 and the amplifier 108. However, some implementations, the optical filter system 130 may be between the pre-amplifier 207 and the light-generation module 304. Further, the light-generation system 205 may include more than one pre-amplifier 207. In these implementations, the optical filter system 130 may be between any two of the pre-amplifiers 207, or between the light-generation module 204 and the pre-amplifier 207 nearest to the module 304.

Figure 4:
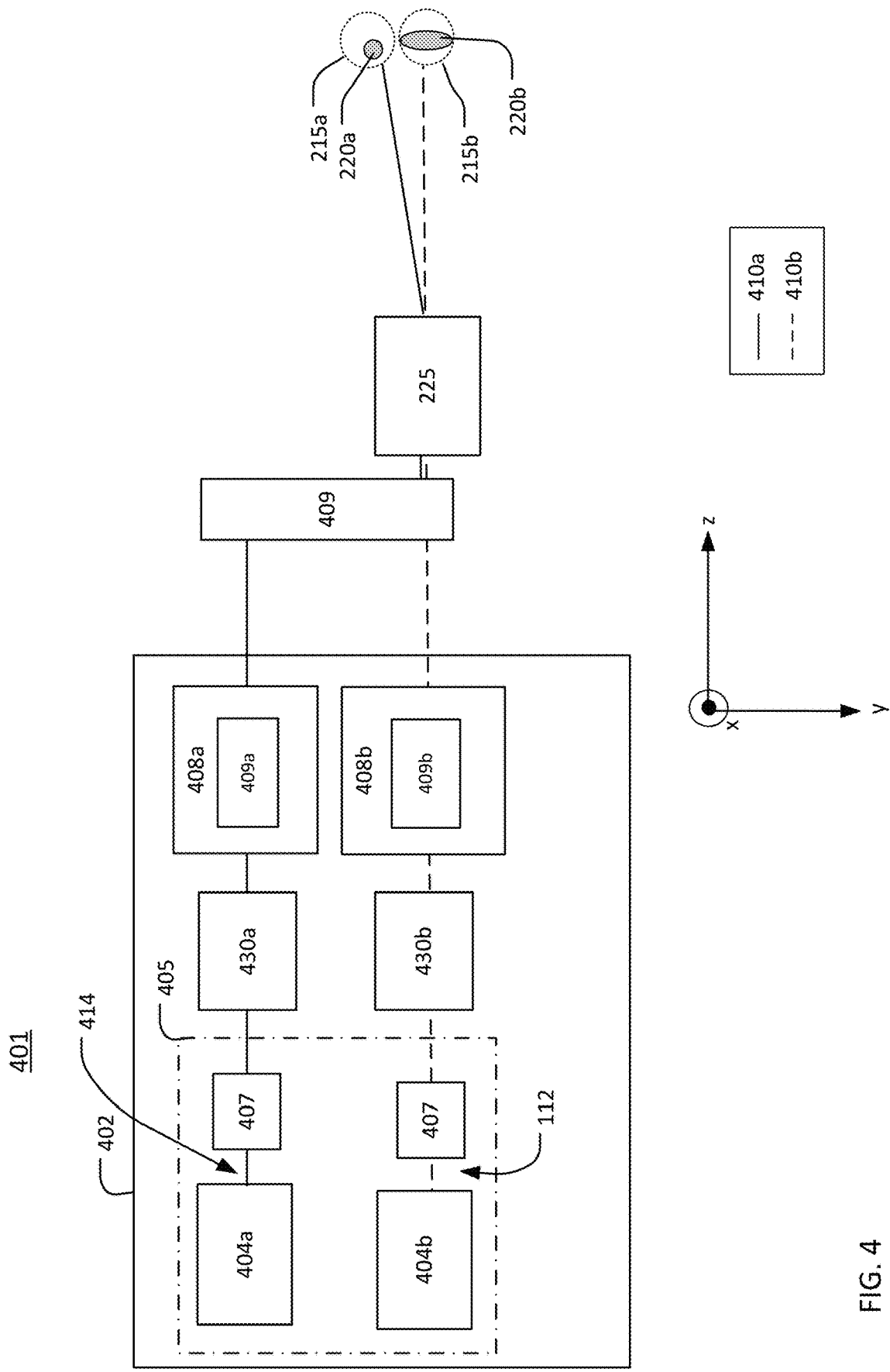

Referring to FIG. 4, a block diagram of an EUV light source 401 that includes another exemplary optical source 402 is shown. The optical source 402 may be used as the optical source 102 (FIG. 1). The optical source 402 includes a light-generation system 405. The light generation system 405 includes a first light-generation module 404a, which generates a first light beam 410a, and a second light-generation module 404b, which generates a second light beam 410b. The first light beam 410a and the second light beam 410b propagate on different paths 414, 112, respectively. In the example of FIG. 4, the first light beam 410a is shown with a solid line, and the second light beam 410b is shown with a dashed line. The first light beam 410a is used to condition the initial target 220a, and the second light beam 410b to convert the conditioned target into a plasma that emits EUV light.

The first light-generation module 404a and the second light-generation module 404b are separate optical sources. The first light-generation module 404a may be, for example, a solid-state laser, and the second light-generation module 404b may be a $CO_2$ laser. The first light-generation module 404a emits the first light beam 410a onto a path 414. The light beams 410a, 410b are amplified in separate amplifier chains. In the example shown in FIG. 4, the first light beam 410a is amplified by an amplifier 408a, which includes a gain medium 409a. The second light beam 410b is amplified by an amplifier 408b, which includes a gain medium 409a. The amplifiers 408a, 408b are separate amplifiers, though they may have the same properties. Thus, in the optical source 402, the first light beam 410a and the second light beam 410b are amplified separately from each other and in different paths. Either or both of the first light beam 410a and the second light beam 410b may be amplified by a pre-amplifier 407 prior to being amplified by the amplifiers 408a, 408b, respectively.

The EUV light source 401 also includes a beam combiner 409. The beam combiner 409 receives the first light beam 410a and the second light beam 410b and directs the beams 410a, 410b on to the beam path 112 and toward the beam delivery system 225. The beam combiner 409 may be any optical element or a collection of optical elements capable of interacting with the first beam 410a and/or the second beam 410b to direct the first and second beams 410a, 410b onto the beam path 112. For example, the beam combiner 409 may be a collection of mirrors, some of which are positioned to direct the first beam 410a onto the beam path 112 and others of which are positioned to direct the second beam 410b such that the second beam remains on the beam path 112.

The optical source 402 also includes optical filter systems 430a and 430b. The optical filter system 430a is on the path 414, and the optical filter system 430b is on the path 112. The optical filter systems 430a, 430b may be similar to the optical filter system 130 (FIG. 1).

Other configurations of the components of the optical source 402 are possible. For example, the light-generation module 404a may be used without the pre-amplifier 407 and/or the optical filter system 130. The optical filter system 130 may be positioned at other locations along the path 112 and/or the path 414. The light-generation module 404a may be placed in another location relative to the target region 215a.

Figure 5:
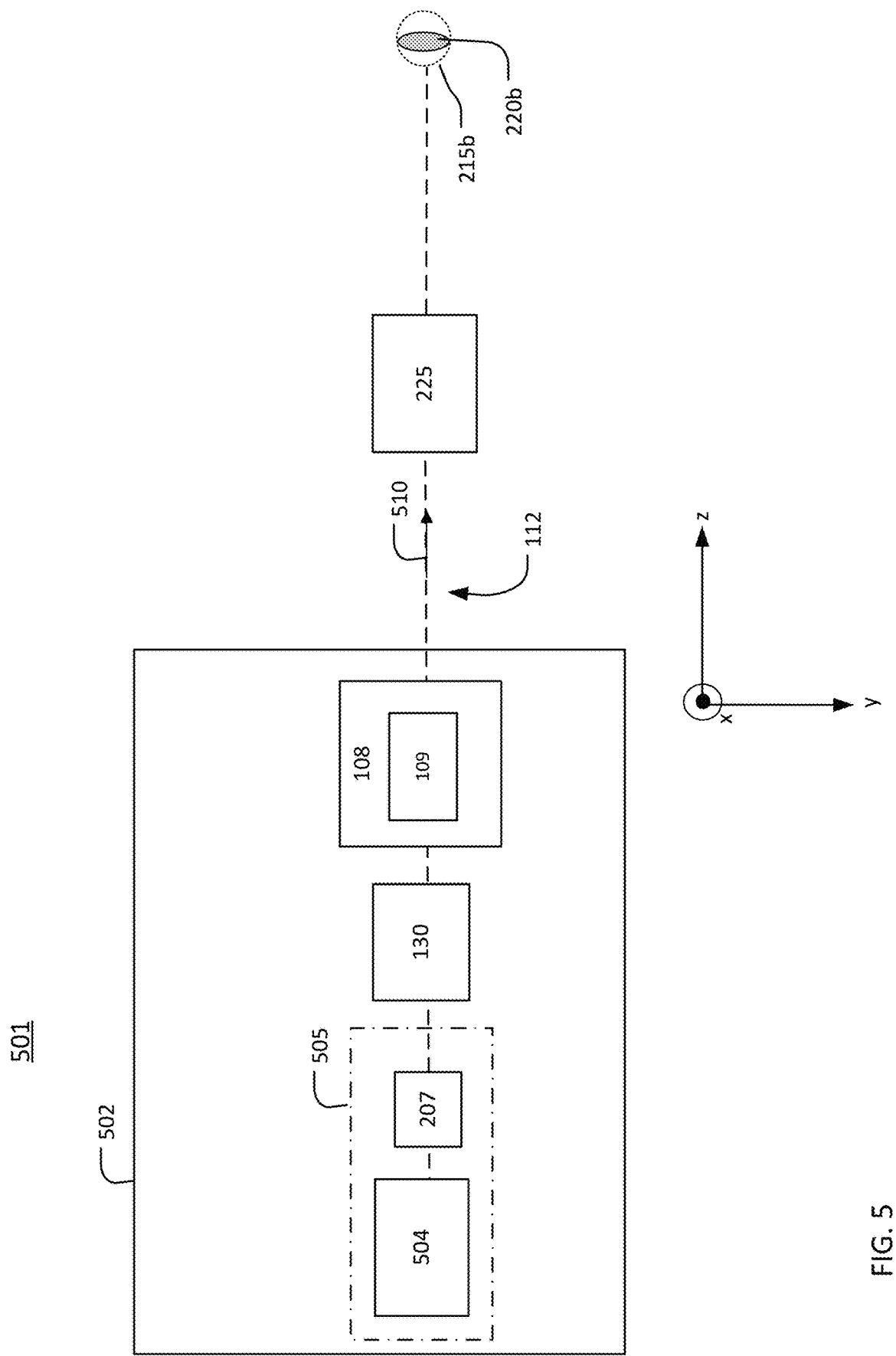

Referring to FIG. 5, a block diagram of another exemplary EUV source 501 is shown. The EUV source 501 includes an optical source 502. The optical source 502 includes a light-generation system 505, the optical filter system 130, and the amplifier 108. The light-generation system 505 includes a light-generation module 504, which emits a light beam 510 onto the path 112, and one or more pre-amplifiers that amplify the light beam 510. The light-generation module 504 may be, for example, a $CO_2$ laser or a semiconductor laser. The one or more pre-amplifiers are represented in FIG. 5 as the element 207. The light beam 510 is used to convert the target 120 into a plasma that emits EUV light. The light beam 510 includes one of more wavelengths in the gain band of the gain medium 109.

The optical source 502 also includes the optical filter system 130. In the example shown, the optical filter system 130 is between the light-generation module 504 and the amplifier 108 by being between the pre-amplifier 207 and the amplifier 108. However, the optical filter system 130 may be positioned at any location along the path 112.

Figure 6:
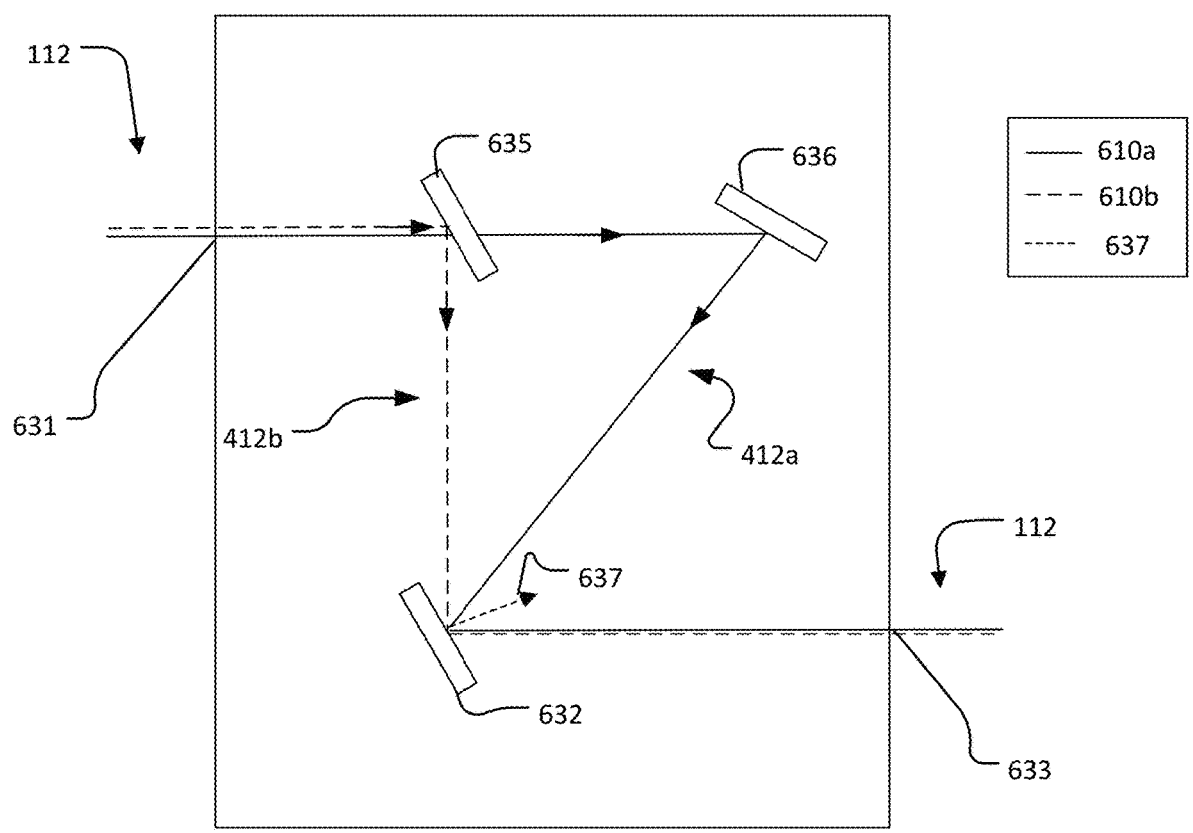

FIGS. 6, 7, 8A, and 9A show exemplary optical filters. Referring to FIG. 6, a block diagram of an exemplary optical filter system 630 is shown. The optical filter system 630 may be used in an optical source in which two or more initial light beams with different wavelengths propagate on the path 112. The wavelengths of the initial light beams are within the gain band of the gain medium 109. For example, the optical filter system 630 may be used as the optical filter system 130 in the optical source 202 (FIG. 2) or the optical source 302 (FIG. 3). When used in the optical source 202 or 302, the optical filter system 130 is on the path 112 between a light-generation module and the amplifier 108, with the light-generation module 204a, 204b or 304, respectively, being closer to an entrance side 631 of the optical filter system 630 than to an exit side 633.

The light beam 610a has a first wavelength in the gain band, and the light beam 610b has a second wavelength in the gain band. The light beam 610a may be, for example, the light beam 210a (FIG. 2) or the light beam 310a (FIG. 3). The light beam 610b may be, for example, the light beam 210b (FIG. 2) or the light beam 310b (FIG. 3). The first and second wavelengths are within the gain band of the gain medium 109, and the first and second wavelengths form a first set of wavelengths.

Light that propagates on the path 112, including the first light beam 610a and the second light beam 610b, enters the optical filter system 630 at the entrance 631. The optical filter system 630 includes a dichroic element 635 that reflects the light beam 610a onto a beam path 412a and transmits the light beam 610b onto a beam path 412b. The dichroic element 635 may be any optical element that separates incident light based on wavelength. For example, the dichroic element 635 may be a dichroic beam splitter or a dichroic mirror. The light beam 610a is transmitted through the dichroic element 635 onto the beam path 412a, which is between the dichroic element 635 and a dispersive optical element 632. The shape of the beam path 412a is determined by the positioning of a steering optical element 636, which is between the dichroic element 635 and the dispersive optical element 632.

The beam 610a propagates on the beam path 412a and is reflected by the steering optical element 636. The steering optical element 636 may be any optical element capable of reflecting the light beam 610a. For example, the steering optical element 636 may be a mirror. The steering optical element 636 is positioned to direct the light beam 610a toward the dispersive optical element 632. The dispersive optical element 632 may be any element that deflects incident light at an angle that depends on the wavelength of the incident light. For example, the dispersive optical element 632 may be a grating or a prism. The dispersive optical element 632 reflects the light beam 610a onto the beam path 112.

The light beam 610b is reflected from the dichroic element 635 onto the beam path 412b, which is distinct from the beam path 412a. The light beam 610b is incident on the dispersive optical element 632, which deflects the light beam 610b onto the beam path 112. As noted above, the dispersive optical element 632 deflects incident light at an angle that depends on the wavelength of the incident light. The dispersive optical element 632 is oriented relative to the direction of propagation of the light beams 610a, 610b on the paths 412a, 412b such that the light having the first wavelength in the light beam 610a and the light having the second wavelength in the light beam 610b is directed onto the beam path 112. The dispersive optical element 632 also deflects light in the light beams 610a, 610b having wavelengths other than the first and second wavelength away from the path 112. In this way, the dispersive optical element 632 recombines the light beams 610a, 610b such that light having the first and second wavelengths in the light beams 610a, 610b propagate on the beam path 112 toward the exit 633 of the optical filter system 630.

In addition to the light beams 610a, 610b, light produced by ASE may propagate on the beam path 112. The optical filter system 630 removes spurious light produced by ASE from the path 112. The light produced by ASE is unpredictable. Thus, the light produced by ASE may propagate on the path 112 at any time, concurrently with either or both of the light beams 610a, 610b or during time periods when neither light beam 610a, 610b is propagating. The light produced by ASE may have any wavelength in the gain band, including other wavelengths 637, which are different from the first and second wavelengths. The other wavelengths 637 form a second set of wavelengths that are in the gain band of the gain medium 109. The dispersive optical element 632 deflects light having the other wavelengths 637 out of the path 112. Thus, the dispersive optical element 632 removes the other wavelengths 637 from the path 112.

The optical filter system 630 may be used to remove ASE light that propagates on the path 112 in the z direction and reflections of ASE light that propagate on the path 112 in the −z directions. The orientation and optical properties of the dispersive optical element 632 are such that the wavelengths in the second set of wavelengths are removed (in this example by deflection) from the beam path 112 regardless of the direction in which the ASE light propagates. For example, the dispersive optical element 632 may be a diffraction grating with a periodic structure that diffracts incident light into a plurality of beams of different wavelengths. After the incident beam interacts with the periodic surface of the grating, each of the plurality of beams propagate away from the grating in a different direction, with the direction of propagation being determined by the wavelength of the particular beam and the period of the grating. Thus, the orientation of the periodic surface relative to the path 112 determines the direction of propagation of light of various wavelengths.

Figure 7:
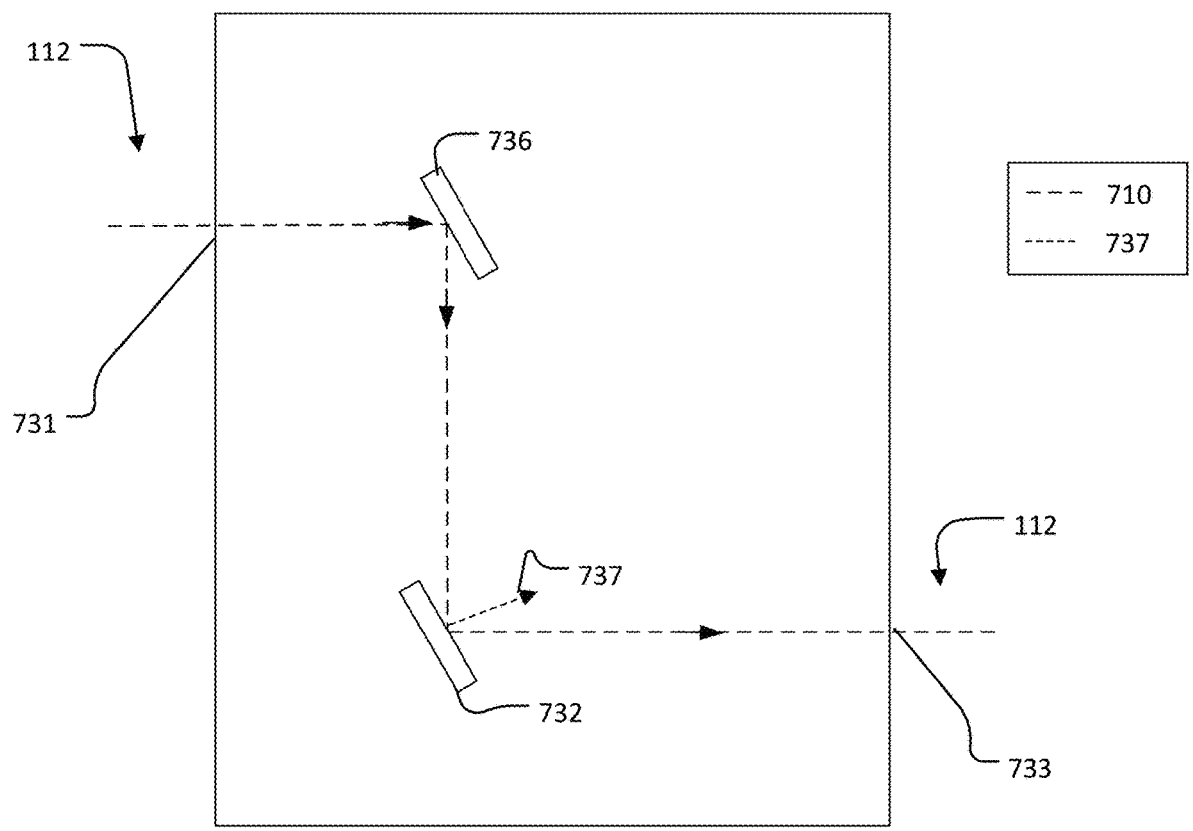

Referring to FIG. 7, a block diagram of another exemplary optical filter system 730 is shown. The optical filter system 730 may be used in any optical system in which it may be desirable to allow light of one wavelength or of one band of wavelengths to propagate on the path 112. For example, the optical filter system 730 may be used in either or both of the paths 414 and 112 of the source 402 (FIG. 4) or in the optical source 502 (FIG. 5). The optical filter system 730 has an entrance 731 and an exit 733. Light propagating in the z direction enters the optical filter system 730 at the entrance 731 and leaves at the exit 733. However, light propagating in the −z direction also may be filtered by the optical filter system 730. Light propagating in the −z direction is incident on the optical filter system 730 at the exit 733 and (if not removed from the path 112), leaves the optical filter system 730 at the entrance 731. When used in the optical source 402 or the optical source 502, the optical filter system 730 is positioned on the path (for example, the path 412 or the path 112) between a light-generation module and an amplifier, with the entrance 731 being closer to the light-generation module than the exit 733.

In the example of FIG. 7, a beam 710 (longer dashed line) propagates through the optical filter system 730. The beam 710 may be, for example, any of the beams 410a, 410b, and 510. For example, the optical filter system 730 may be placed on either or both of the paths 412a, 412b of the optical source 402 (FIG. 4). The optical filter system 730 includes a removal optical element 732, which removes light from an optical path that has a wavelength in a second set of wavelengths other than the wavelengths in the beam 710. The wavelengths in the second set of wavelengths are wavelengths that are in the gain band, and the second set of wavelengths may include any or all of the wavelengths in the gain band that are not in the light beam 710.

The removal optical element 732 may be a dispersive optical element, such as a prism or a grating, that deflects incident light at an angle that depends on the wavelength of the incident light. The optical filter system 730 may include a steering optical element 736, which directs the beam 710 to the removal optical element 732. The removal optical element 732 is oriented and has optical properties such that the beam 710 is reflected onto the path 112. However, light 737, which has a wavelength in the second set of wavelengths (for example, light generated by ASE), is reflected away from the path 112. In this way, the removal optical element 732 removes light having a wavelength in the second set of wavelengths from the path 112, or substantially reduces the amount of light having a wavelength in the second set of wavelengths that propagates on the path 112.

In other implementations, the removal optical element 732 may be an element other than a dispersive optical element. For example, the removal optical element 732 may be a filtering and absorbing element that absorbs light having a wavelength in the second set of wavelengths and transmits light having a wavelength in the first set of wavelengths. Regardless of its particular implementation, the optical filter system 730 allows the beam 710 to remain on the path 112 while rejecting light (such as ASE) that has a wavelength in the second set of wavelengths.

Referring to FIG. 8A, a block diagram of another exemplary optical filter system 830 is shown. The optical filter system 830 allows initial light beams 810a, 810b to pass while blocking light of other wavelengths (such as light arising from ASE). The optical filter system 830 may be used in an optical source that uses two or more initial light beams with different wavelengths in the gain band of the gain medium 109. For example, the optical filter system 830 may be used as the optical filter system 130 in the optical source 202 (FIG. 2) or the optical source 302 (FIG. 3). When used in the optical source 202 or 302, the optical filter system 830 is on the path 112 between a light-generation module and the amplifier 108, with the light-generation module being closer to an entrance side 831 of the system 830 than to an exit side 833. Light traveling on the path 112 from the light-generation module enters the optical filter system 130 at the entrance side 831 and leaves the optical filter system 130 at the exit side 833.

The light beam 810a (represented by a solid line) has a first wavelength, and the light beam 810b (represented by a dashed line) has a second wavelength. The light beam 810a may be, for example, the light beam 210a (FIG. 2) or the light beam 310a (FIG. 3). The light beam 810b may be, for example, the light beam 210b (FIG. 2) or the light beam 310b (FIG. 3). The first and second wavelengths are within the gain band of the gain medium 109, and the first and second wavelengths form a first set of wavelengths.

The light beams 810a and 810b enter the optical filter system 830 at the entrance side 831. The optical filter system 830 includes dichroic optical elements 835, which may be any optical element capable of separating incident light based on the wavelength of the incident light. For example, the dichroic optical elements 835 may be dichroic beam splitters, dichroic mirrors, or a combination of such elements. One of the dichroic optical elements 835 transmits the light beam 810a onto a path 812a and reflects the light beam 810b onto a path 812b.

The paths 812a, 812b are defined by respective sets of optical filtering elements 832a, 832b. The optical filtering elements 832a and 832b are optical elements that reflect, transmit, or absorb incident light based on the wavelength of the light. The optical filtering elements 832a reflect light having the first wavelength (the wavelength of the light beam 810a) to direct the light beam 810a on the path 812a. The optical filtering elements 832a absorb and/or transmit light of wavelengths other than the first wavelengths. The optical filtering elements 832b reflect light having the second wavelength (the wavelength of the light beam 810b) to direct the light beam 810b on the path 812b. The optical filtering elements 832b absorb and/or transmit light of wavelengths other than the second wavelength. The optical filtering elements 832a, 832b may include a beam dump, beam trap, or beam block that absorbs some or all of the light that is not reflected. In this way, the optical filtering elements 832a, 832b reflect only light having a wavelength in the first set of wavelengths.

After being reflected by the optical filtering elements 832a, 832b, the light beams 810a, 810b are directed onto the path 112 by the other of the dichroic optical elements 835 (the dichroic optical element closest to the exit side 833). In this way, the set of optical filtering elements 832a and the set of optical filtering elements 832b allow light having a wavelength in the first set of wavelengths to remain on the path 112 while removing light having other wavelengths in the gain band of the medium 109 from the path 112.

In the example of FIG. 8A, the optical filtering elements 832a are notch filters that reflect only a narrow band of light centered around the wavelength of the first beam 810a, and the optical filtering elements 832b are notch filters that reflect only a narrow band of light centered around the wavelength of the second beam 810b. Wavelengths other than those that are reflected by the optical filtering elements 832a, 832b (such as ASE) are absorbed and/or transmitted and are thus not directed onto the paths 812a, 812b.

Referring also to FIG. 8B, which is a side block diagram of an exemplary optical filtering element 832, each of the optical filtering elements 832a, 832b may include, for example, a substrate 838 and a coating 839 on the substrate. The substrate 838 may be, for example, copper. The reflectance properties of the optical filtering elements 832a, 832b may be determined by the properties of the coating 839. For example, the wavelengths that are reflected by the coating are determined by one or more of the material and thickness of the coating. The coating 839 may be, for example, zinc selenide (ZnSe). The coating 839 may be, for example, a layered stack of dielectric material selected to reflect a narrow band of wavelengths. The layered stack may include, for example, two dielectric materials each with a different index of refraction.

For implementations in which the wavelength of the first beam 810a is 10.26 µm, each of the optical filtering elements 832a may include two optical filtering elements, each one having a ZnSe coating 839. The thickness of the coating may be, for example, 70-80 µm along a direction 841, which is parallel to a normal of the surface 838. The two optical filtering elements may have different thicknesses along the direction 841. Together, the two filtering elements form a notch filter that reflects about 95% of incident light at 10.26 µm and reflects very little light of other wavelengths. For implementations in which the wavelength of the second beam 810b is 10.6 µm, each of the optical filtering elements 832b may include two optical filtering elements, one having a ZnSe coating 839 that has a thickness t of about 76 µm thick and the other having a ZnSe coating 839 with a thickness t of about 82 µm. Together, the two filtering elements form a notch filter that reflects about 95% of incident light at 10.6 µm but very little light of other wavelengths.

Referring to FIG. 9A, another exemplary optical filter system 930 is shown. The optical filter system 930 allows initial light beams 910a, 910b to pass while blocking light of other wavelengths (such as light arising from ASE). The optical filter system 930 may be used in an optical source that uses two or more initial light beams with different wavelengths in the gain band of the gain medium 109. For example, the optical filter system 930 may be used as the optical filter system 130 in the optical source 202 (FIG. 2) or optical source 302 (FIG. 3). When used in the optical source 202 or 302, the optical filter system 930 is on the path 112 between a light-generation module and the amplifier 108, with the light-generation module being closer to an entrance side 931 of the system 930 than to an exit side 933. Light traveling on the path 112 from the light-generation module 104 enters the optical filter system 130 at the entrance side 931 and leaves the optical filter system 130 at the exit side 933.

The light beam 910a (represented by a solid line) has a first wavelength, and the light beam 910b (represented by a dashed line) has a second wavelength. The light beam 910a may be, for example, the light beam 210a (FIG. 2) or the light beam 310a (FIG. 3). The light beam 910b may be, for example, the light beam 210b (FIG. 2) or the light beam 310b (FIG. 3). The first and second wavelengths are within the gain band of the gain medium 109, and the first and second wavelengths form a first set of wavelengths.

The light beams 910a and 910b enter the optical filter system 930 at the entrance side 931. The optical filter system 930 includes a set of optical filtering elements 932 on the path 112. The optical filtering elements 932 reflect the wavelengths of the light beams 910a, 910b, and may reflect light having a wavelengths between the wavelengths of the light beams 910a, 910b. The optical filtering elements 932 may transmit and/or absorb light having other wavelengths (such as light arising from ASE). In this way, the optical filtering elements 932 allow the light beams 910a, 910b to remain on the path 112 while removing other wavelengths from the path 112. Each of the set of optical filtering elements 932 may be a band-pass filter that includes a substrate 938 and a coating 939 on the substrate. The coating 939 may be a stack of layers of dielectric material or a coating of a material such as, for example, ZnSe.

Figure 10:
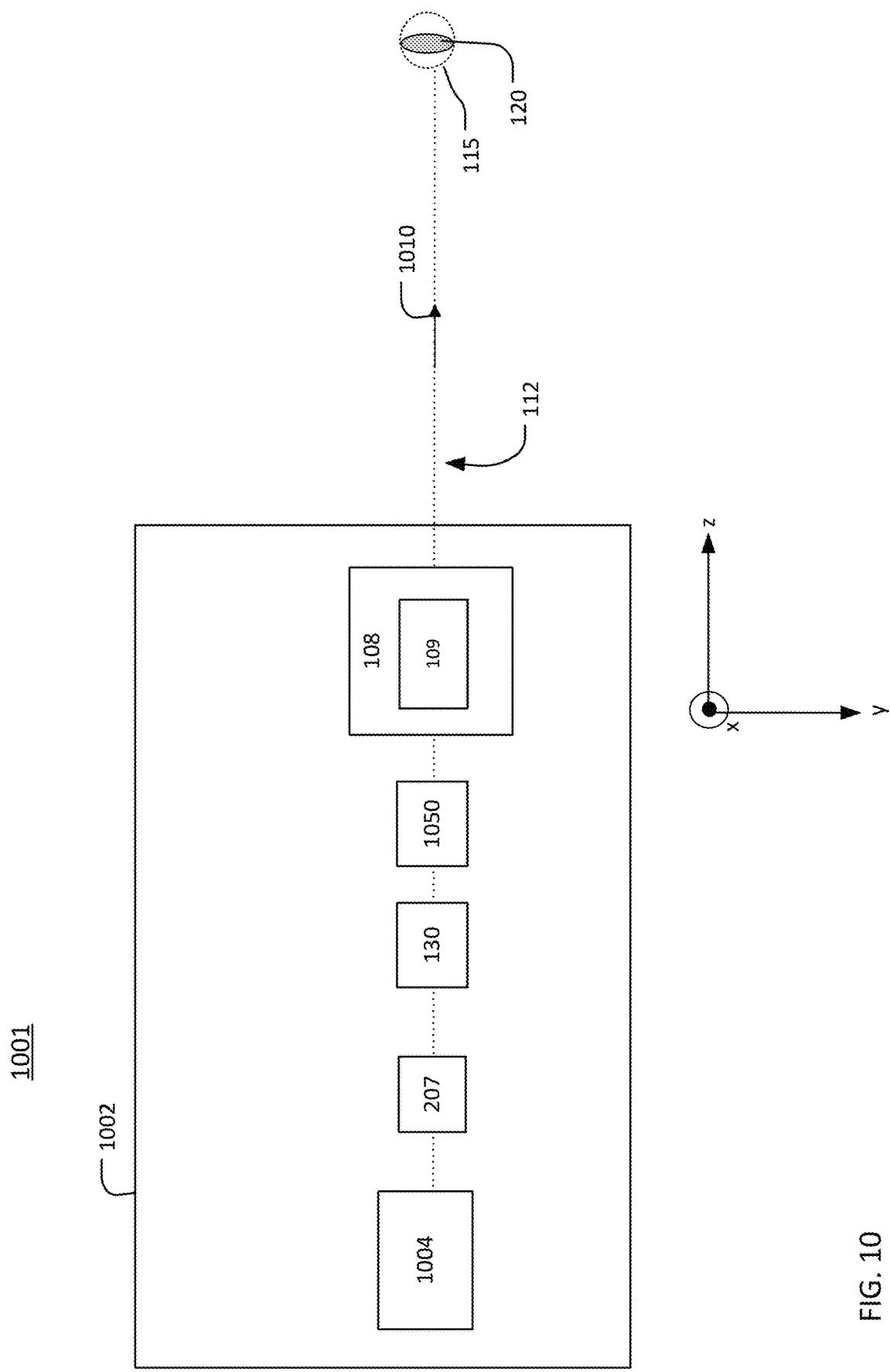

FIGS. 10 and 11 show additional exemplary EUV light sources that include the optical filter system 130 (or any of the optical filter systems 630-930). FIG. 10 is a block diagram of another exemplary EUV light source 1001. The EUV light source 1001 illustrates that the optical filter system 130 (or any of the optical filter systems 630-930) may be used with an additional optical isolation device 1050 in any light source. FIG. 11 illustrates the various possible locations that the optical filter system 130 (or any of the optical filter systems 630-930) may be placed.

The EUV light source 1001 includes an optical source 1002 that generates a light beam 1010 on the path 112. The optical source 1002 includes a light-generation module 1004, a pre-amplifier 207, the optical filter system 130, and the amplifier 108. In this example, the optical filter system 130 is on the path 112 between the pre-amplifier 207 and the amplifier 108. The optical isolation device 1050 is placed on the path 112 between a light-generation module 1004 and the target region 115. In the example of FIG. 10, the optical isolation device 1050 is between the optical filter system 130 and the amplifier 108. In other implementations, the optical filter system 130 and/or the optical isolation device 1050 may be in other locations along the path 112.

The optical isolation device 1050 is used to block reflections from the target region 115, including reflections of the light beam or beams generated by the light-generation module 1004. The optical isolation device 1050 is based on a mechanism other than wavelength selection. Thus, the optical isolation device 1050 and the optical filter system 130 may be complementary, and using the optical isolation device 1050 with the optical filter system 130 may lead to improved optical separation between the target region 115 and the components of the optical source 1002 (including the light-generation module 1004).

The optical isolation device 1050 may be, for example, an isolation device that is polarization-based. A polarization-based optical isolation device transmits light of a first polarization (allows such light to remain on the path 112) and blocks light of a second polarization (such that light having that polarization is not able to propagate on the path 112). The optical isolation device 1050 may be, for example, a spatial filter, such as a pinhole or other aperture.

FIG. 11 is a block diagram of another exemplary EUV light source 1100. The EUV light source 1100 includes an optical source 1102 that generates a light beam 1110 on the path 112. The optical source 1102 includes a light-generation module 1104, a plurality of pre-amplifiers 207, the optical filter system 130, and a plurality of amplifiers 108. The optical source 1102 also includes the optical filter system 130. The optical filter system 130 is not shown in FIG. 11. Instead, the X marks on the path 112 illustrate the various locations on the path 112 where the optical filter system 130 may be placed. The optical filter system 130 may be placed directly downstream (in the z direction in this example) of the light-generation module 1104. The optical filter system 130 may be placed between any two of the pre-amplifiers 207, between any two of the amplifiers 108, and/or between the final pre-amplifier 207 and the first amplifier 108.

Placing the optical filter system 130 in the location labeled 1189 may help prevent light that includes undesired wavelengths (such as the wavelengths in the second set of wavelengths) and travels in the z direction from reaching the amplifier or amplifiers 108. Additionally, placing the optical filter system 130 in the location labeled 1189 may help prevent reflections that travel in the −z direction and are amplified by at least one amplifier 108 from reaching the light-generation system 205. Because the amplifiers 108 may have a higher gain than the pre-amplifier 207, placing the optical filter system 130 in the location labeled 1189 may help to prevent large reflections from entering the light-generation system 205 and also may help to prevent light having undesired wavelengths from being amplified in the high-gain portion of the light source 1100.

Referring to FIG. 12A, an LPP EUV light source 1200 is shown. The optical sources 202-502, 1002, and 1102 may be part of an EUV light source, such as the source 1200. The LPP EUV light source 1200 is formed by irradiating a target mixture 1214 at a target location 1205 with an amplified light beam 1210 that travels along a beam path toward the target mixture 1214. The target material of the targets 120, 220a, and 220b may be or include the target mixture 1214. The target location 1205, which is also referred to as the irradiation site, is within an interior 1207 of a vacuum chamber 1230. When the amplified light beam 1210 strikes the target mixture 1214, a target material within the target mixture 1214 is converted into a plasma state that has an element with an emission line in the EUV range. The created plasma has certain characteristics that depend on the composition of the target material within the target mixture 1214. These characteristics may include the wavelength of the EUV light produced by the plasma and the type and amount of debris released from the plasma.

The light source 1200 also includes a target material delivery system 1225 that delivers, controls, and directs the target mixture 1214 in the form of liquid droplets, a liquid stream, solid particles or clusters, solid particles contained within liquid droplets or solid particles contained within a liquid stream. The target mixture 1214 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 1214 may also include impurities such as non-target particles. Thus, in the situation in which there are no impurities, the target mixture 1214 is made up of only the target material. The target mixture 1214 is delivered by the target material delivery system 1225 into the interior 1207 of the chamber 1230 and to the target location 1205.

The light source 1200 includes a drive laser system 1215 that produces the amplified light beam 1210 due to a population inversion within the gain medium or mediums of the laser system 1215. The light source 1200 includes a beam delivery system between the laser system 1215 and the target location 1205, the beam delivery system including a beam transport system 1220 and a focus assembly 1222. The beam transport system 1220 receives the amplified light beam 1210 from the laser system 1215, and steers and modifies the amplified light beam 1210 as needed and outputs the amplified light beam 1210 to the focus assembly 1222. The focus assembly 1222 receives the amplified light beam 1210 and focuses the beam 1210 to the target location 1205.

In some implementations, the laser system 1215 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 1215 produces an amplified light beam 1210 due to the population inversion in the gain media of the laser amplifiers even if there is no laser cavity. Moreover, the laser system 1215 may produce an amplified light beam 1210 that is a coherent laser beam if there is a laser cavity to provide enough feedback to the laser system 1215. The term "amplified light beam" encompasses one or more of: light from the laser system 1215 that is merely amplified but not necessarily a coherent laser oscillation and light from the laser system 1215 that is amplified and is also a coherent laser oscillation.

The optical amplifiers in the laser system 1215 may include as a gain medium a filling gas that includes $CO_2$ and may amplify light at a wavelength of between about 9100 and about 11000 nm, and in particular, at about 10600 nm, at a gain greater than or equal to 800. Suitable amplifiers and lasers for use in the laser system 1215 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The optical amplifiers in the laser system 1215 may also include a cooling system such as water that may be used when operating the laser system 1215 at higher powers.

FIG. 12B shows a block diagram of an exemplary drive laser system 1280. The drive laser system 1280 may be used as part of the drive laser system 1215 in the source 1200. The drive laser system 1280 includes three power amplifiers 1281, 1282, and 1283. Any or all of the power amplifiers 1281, 1282, and 1283 may include internal optical elements (not shown).

Light 1284 exits the power amplifier 1281 through an output window 1285 and is reflected off a curved mirror 1286. After reflection, the light 1284 passes through a spatial filter 1287, is reflected off of a curved mirror 1288, and enters the power amplifier 1282 through an input window 1289. The light 1284 is amplified in the power amplifier 1282 and redirected out of the power amplifier 1282 through an output window 1290 as light 1291. The light 1291 is directed toward the amplifier 1283 with a fold mirror 1292 and enters the amplifier 1283 through an input window 1293. The amplifier 1283 amplifies the light 1291 and directs the light 1291 out of the amplifier 1283 through an output window 1294 as an output beam 1295. A fold mirror 1296 directs the output beam 1295 upward (out of the page) and toward the beam transport system 1220 (FIG. 12A).

Referring again to FIG. 12B, the spatial filter 1287 defines an aperture 1297, which may be, for example, a circle having a diameter between about 2.2 mm and 3 mm. The curved mirrors 1286 and 1288 may be, for example, off-axis parabola mirrors with focal lengths of about 1.7 m and 2.3 m, respectively. The spatial filter 1287 may be positioned such that the aperture 1297 coincides with a focal point of the drive laser system 1280.

Referring again to FIG. 12A, the light source 1200 includes a collector mirror 1235 having an aperture 1240 to allow the amplified light beam 1210 to pass through and reach the target location 1205. The collector mirror 1235 may be, for example, an ellipsoidal mirror that has a primary focus at the target location 1205 and a secondary focus at an intermediate location 1245 (also called an intermediate focus) where the EUV light may be output from the light source 1200 and may be input to, for example, an integrated circuit lithography tool (not shown). The light source 1200 may also include an open-ended, hollow conical shroud 1250 (for example, a gas cone) that tapers toward the target location 1205 from the collector mirror 1235 to reduce the amount of plasma-generated debris that enters the focus assembly 1222 and/or the beam transport system 1220 while allowing the amplified light beam 1210 to reach the target location 1205. For this purpose, a gas flow may be provided in the shroud that is directed toward the target location 1205.

The light source 1200 may also include a master controller 1255 that is connected to a droplet position detection feedback system 1256, a laser control system 1257, and a beam control system 1258. The light source 1200 may include one or more target or droplet imagers 1260 that provide an output indicative of the position of a droplet, for example, relative to the target location 1205 and provide this output to the droplet position detection feedback system 1256, which may, for example, compute a droplet position and trajectory from which a droplet position error may be computed either on a droplet by droplet basis or on average. The droplet position detection feedback system 1256 thus provides the droplet position error as an input to the master controller 1255. The master controller 1255 may therefore provide a laser position, direction, and timing correction signal, for example, to the laser control system 1257 that may be used, for example, to control the laser timing circuit and/or to the beam control system 1258 to control an amplified light beam position and shaping of the beam transport system 1220 to change the location and/or focal power of the beam focal spot within the chamber 1230.

The target material delivery system 1225 includes a target material delivery control system 1226 that is operable, in response to a signal from the master controller 1255, for example, to modify the release point of the droplets as released by a target material supply apparatus 1227 to correct for errors in the droplets arriving at the desired target location 1205.

Additionally, the light source 1200 may include light source detectors 1265 and 1270 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 1265 generates a feedback signal for use by the master controller 1255. The feedback signal may be, for example, indicative of the errors in parameters such as the timing and focus of the laser pulses to properly intercept the droplets in the right place and time for effective and efficient EUV light production.

The light source 1200 may also include a guide laser 1275 that may be used to align various sections of the light source 1200 or to assist in steering the amplified light beam 1210 to the target location 1205. In connection with the guide laser 1275, the light source 1200 includes a metrology system 1224 that is placed within the focus assembly 1222 to sample a portion of light from the guide laser 1275 and the amplified light beam 1210. In other implementations, the metrology system 1224 is placed within the beam transport system 1220. The metrology system 1224 may include an optical element that samples or re-directs a subset of the light, such optical element being made out of any material that may withstand the powers of the guide laser beam and the amplified light beam 1210. A beam analysis system is formed from the metrology system 1224 and the master controller 1255 since the master controller 1255 analyzes the sampled light from the guide laser 1275 and uses this information to adjust components within the focus assembly 1222 through the beam control system 1258.

Thus, in summary, the light source 1200 produces an amplified light beam 1210 that is directed along the beam path to irradiate the target mixture 1214 at the target location 1205 to convert the target material within the mixture 1214 into plasma that emits light in the EUV range. The amplified light beam 1210 operates at a particular wavelength (that is also referred to as a drive laser wavelength) that is determined based on the design and properties of the laser system 1215. Additionally, the amplified light beam 1210 may be a laser beam when the target material provides enough feedback back into the laser system 1215 to produce coherent laser light or if the drive laser system 1215 includes suitable optical feedback to form a laser cavity.

Other implementations are within the scope of the claims. For example, any of the optical filter systems 130, 630, 730, 830, and 930 may include more or fewer elements than shown and the elements may be arranged in configurations other than the exemplary configurations shown above. Any of the optical filter systems 130, 630, 730, 830, and 930 may be used with each other, and an optical source may include more than one of a particular optical filter systems.

What is claimed is:

1. An optical source for an extreme ultraviolet (EUV) photolithography tool, the optical source comprising:
    a wavelength-based optical filter system configured to be placed between a light-generation module and an optical amplifier, the wavelength-based optical filter system comprising at least one optical element configured to allow light having a wavelength in a first set of wavelengths to propagate on a beam path toward a target region configured to receive target material that emits EUV light when in a plasma state, and the at least one optical element is further configured to remove light having a wavelength in a second set of wavelengths from the beam path, the first set of wavelengths and the second set of wavelengths comprising different wavelengths in a gain band of the optical amplifier, wherein
    the wavelength-based optical filter system comprises a first beam path and a second beam path that are at least partially spatially distinct, and, in operational use, a first light beam having a first wavelength in the first set of wavelengths propagates on the first beam path, and a second light beam having a second wavelength that is different from the first wavelength and is in the first set of wavelengths propagates on the second beam path such that the first light beam and the second light beam exit the wavelength-based optical filter system onto the beam path and propagate on the beam path toward the target region.

2. The optical source of claim 1, wherein the at least one optical element comprises a dispersive optical element, an optical filtering element, and/or an interferometer.

3. The optical source of claim 2, wherein:
    the dispersive optical element comprises a prism and/or a grating,
    the at least one optical filtering element comprises an optical element comprising a multi-layer coating and/or an optical element configured to absorb light having one or more wavelengths in the second set of wavelengths, and
    the interferometer comprises an etalon.

4. The optical source of claim 3, wherein the dispersive optical element comprises a grating, the grating being positioned to reflect light having a wavelength in the first set of wavelengths onto the beam path, and to reflect light having a wavelength in the second set of wavelengths away from the beam path.

5. The optical source of claim 2, wherein the at least one optical element comprises at least one optical filtering element, the optical filtering element is configured to reflect or transmit light having a wavelength in the first set of wavelengths, and the optical filtering element is configured to absorb light having a wavelength in the second set of wavelengths.

6. The optical source of claim 5, wherein the optical filtering element comprises a copper substrate and a coating on the copper substrate.

7. The optical source of claim 2, wherein the at least one optical element comprises a first set of optical filtering elements and a second set of optical filtering elements, the first set of optical filtering elements arranged to define the first beam path in the optical filter system, and the second set of optical filtering elements arranged to define the second beam path in the optical filter system.

8. The optical source of claim 7, wherein:
the optical filtering elements of the first set are configured to allow light having the first wavelength in the first set of wavelengths to propagate on the first beam path in the optical filter system,
the optical filtering elements of the second set are configured to allow light having the second wavelength in the first set of wavelengths to propagate on the second beam path in the optical filter system, and
the optical filtering elements of the first set and the second set are configured to absorb light having a wavelength in the second set of wavelengths.

9. The optical source of claim 1, wherein the second set of wavelengths comprises all wavelengths in the gain band other than any wavelength that is in the first set of wavelengths.

10. An optical filter system for an extreme ultraviolet (EUV) light source, the optical filter system configured for placement on a beam path between an optical amplifier and a light-generation module of the EUV light source, the optical amplifier comprising a gain medium configured to amplify light within a gain band, the optical filter system further comprising:
at least one optical element, the at least one optical element being configured to reflect or transmit light having a wavelength in a first wavelength band and to reject light having a wavelength in a second wavelength band, the first and second wavelength bands being in the gain band of the amplifier, and the first wavelength band and the second wavelength band comprise entirely different wavelengths, wherein the first wavelength band comprises a first wavelength associated with a pre-pulse beam and a second wavelength associated with a main beam such that, in operational use, the pre-pulse beam and the main beam exit the optical filter system onto the beam path.

11. The optical filter system of claim 10, further comprising at least one dichroic optical element.

12. The optical filter system of claim 10, wherein the at least one optical element comprises an optical filtering element, a dispersive optical element, and/or an interferometer.

13. The optical filter system of claim 12, wherein the dispersive optical element is a prism and/or a grating.

14. The optical filter system of claim 12, wherein the optical filtering element comprises an optical element comprising a multi-layer coating and/or an optical element configured to absorb light having particular wavelengths.

15. The optical filter system of claim 10, wherein the optical element being configured to reject light having a wavelength in a second wavelength band comprises the optical element being configured to absorb light having a wavelength in the second wavelength band.

16. The optical filter system of claim 10, wherein the optical filter system comprises two paths that is are least partially spatially distinct from each other, and, in operational use, the pre-pulse beam travels on one of the two paths and the main pulse travels on the other of the two paths.

17. A method comprising:
directing a light beam onto a beam path, the beam path being between the light-generation module and a plasma site, and the light beam having a first wavelength;
directing a second light beam onto the beam path, the second light beam comprising light having a second wavelength;
passing the light beam and the second light beam through an optical filter system;
directing light that exits the optical filter system to an optical amplifier to produce an amplified light beam, the optical amplifier comprising a gain medium that amplifies light that is in a gain band; and
providing the amplified light beam to a plasma site, the plasma site receiving target material that, when in a plasma state, emits EUV light, wherein
the first wavelength is in the gain band of the optical amplifier,
the second wavelength is in the gain band of the optical amplifier,
the optical filter system allows light having the first wavelength and light having the second wavelength to propagate on the beam path, and
the optical filter system removes light having a wavelength other than the first wavelength or the second wavelength and is in the gain band of the optical amplifier from the beam path.

18. An optical source for a photolithography tool, the optical source comprising:
a light-generation module;
an optical amplifier configured to hold a gain medium, the optical amplifier being configured for placement such that the gain medium is on a beam path, the gain medium being associated with a gain band, the optical amplifier being configured to amplify light having a wavelength in the gain band; and
a wavelength-based optical loss system configured for placement on the beam path between the light-generation module and the optical amplifier, the wavelength-based optical loss system configured to: remove light at more than one wavelength in the gain band from the beam path, and to allow light in two distinct light beams to remain on the beam path, the light in each of the two distinct light beams having a different wavelength in the gain band.

19. The optical source of claim 1, further comprising the light-generation module.

20. The optical source of claim 19, wherein the light-generation module comprises more than one light-generation module, one of the light-generation modules being configured to generate the first light beam, and another one of the light-generation modules being configured to generate the second light beam.

21. The optical source of claim 19, wherein the optical source further comprises one or more optical pre-amplifiers positioned to receive light emitted from the light-generation module.

22. The optical source of claim 21, wherein the wavelength-based optical filter system is between at least one of the optical pre-amplifiers and the light-generation module.

23. The optical source of claim 22, wherein the optical source comprises more than one optical pre-amplifier, and the wavelength-based optical filter system is between two optical pre-amplifiers.

24. The optical source of claim 1, further comprising the optical amplifier.

25. The optical source of claim 24, wherein:
the optical amplifier comprises a first optical amplifier and a second optical amplifier,
the first optical amplifier comprises a first gain medium having a first gain band,
the second optical amplifier comprises a second gain medium having a second gain band,
the first set of wavelengths and the second set of wavelengths are the first and second gain bands,
the first gain medium is on the first beam path, and
the second gain medium is on the second beam path.

* * * * *

UNITED STATES PATENT AND TRADEMARK OFFICE
CERTIFICATE OF CORRECTION

PATENT NO. : 10,663,866 B2
APPLICATION NO. : 15/270072
DATED : May 26, 2020
INVENTOR(S) : Alexander Anthony Schafgans et al.

It is certified that error appears in the above-identified patent and that said Letters Patent is hereby corrected as shown below:

In the Claims

Claim 25, Lines 8-9, "the first set of wavelengths and the second set of wavelengths are the first and second gain bands" should read – the first set of wavelengths and the second set of wavelengths are in the first and second gain bands –.

Signed and Sealed this
Thirtieth Day of June, 2020

Andrei Iancu
*Director of the United States Patent and Trademark Office*